US011545438B2

(12) United States Patent
Hsieh et al.

(10) Patent No.: US 11,545,438 B2
(45) Date of Patent: Jan. 3, 2023

(54) SEMICONDUCTOR PACKAGES AND METHODS OF FORMING THE SAME

(71) Applicant: Taiwan Semiconductor Manufacturing Company, Ltd., Hsinchu (TW)

(72) Inventors: Cheng-Yen Hsieh, Hsinchu (TW); Chun-Hui Yu, Hsinchu County (TW); Ping-Kang Huang, Chiayi (TW); Sao-Ling Chiu, Hsinchu (TW); Yi-Jhang Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/090,899

(22) Filed: Nov. 6, 2020

(65) Prior Publication Data
US 2021/0202389 A1    Jul. 1, 2021

Related U.S. Application Data

(60) Provisional application No. 62/953,523, filed on Dec. 25, 2019.

(51) Int. Cl.
| | |
|---|---|
| *H01L 23/31* | (2006.01) |
| *H01L 25/065* | (2006.01) |
| *H01L 23/538* | (2006.01) |
| *H01L 21/50* | (2006.01) |

(52) U.S. Cl.
CPC .......... *H01L 23/5384* (2013.01); *H01L 21/50* (2013.01); *H01L 23/31* (2013.01); *H01L 23/5381* (2013.01); *H01L 23/5383* (2013.01); *H01L 23/5385* (2013.01); *H01L 23/5386* (2013.01); *H01L 25/0657* (2013.01)

(58) Field of Classification Search
CPC . H01L 23/5384; H01L 23/31; H01L 23/5381; H01L 23/5383; H01L 23/5385; H01L 23/5386; H01L 21/50; H01L 25/0657
See application file for complete search history.

(56) References Cited

U.S. PATENT DOCUMENTS

| | | |
|---|---|---|
| 3,993,380 A | 11/1976 | Lumm, Jr. et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,164,817 B2 * | 11/2021 | Rubin .................... H01L 21/568 |
| 2018/0102470 A1 * | 4/2018 | Das ......................... H01L 25/50 |
| 2021/0125967 A1 * | 4/2021 | Zhai ........................ H01L 24/97 |

* cited by examiner

*Primary Examiner* — Timor Karimy
(74) *Attorney, Agent, or Firm* — JCIPRNET

(57) ABSTRACT

A semiconductor package includes a first interposer, a second interposer, a first die, a second die and at least one bridge structure. The first interposer and the second interposer are embedded by a first dielectric encapsulation. The first die is disposed over and electrically connected to the first interposer. The second die is disposed over and electrically connected to the second interposer. The at least one bridge structure is disposed between the first die and the second die.

20 Claims, 36 Drawing Sheets

SEMICONDUCTOR PACKAGES AND METHODS OF FORMING THE SAME

CROSS-REFERENCE TO RELATED APPLICATION

This application claims the priority benefit of U.S. provisional application Ser. No. 62/953,523, filed on Dec. 25, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic devices, e.g., transistors, diodes, resistors, capacitors, etc. For the most part, this improvement in integration density has come from successive reductions in minimum feature size, which allows more devices to be integrated into a given area.

These smaller electronic devices also require smaller packages that occupy less area than previous packages. One of the promising semiconductor packages is a "chip on wafer on substrate (CoWoS)" structure for advanced products targeting cloud computing, data center, and super computer applications. Although the existing semiconductor packages have been generally adequate for their intended purposes, they have not been entirely satisfactory in all respects.

DETAILED DESCRIPTION

Figure 1A:
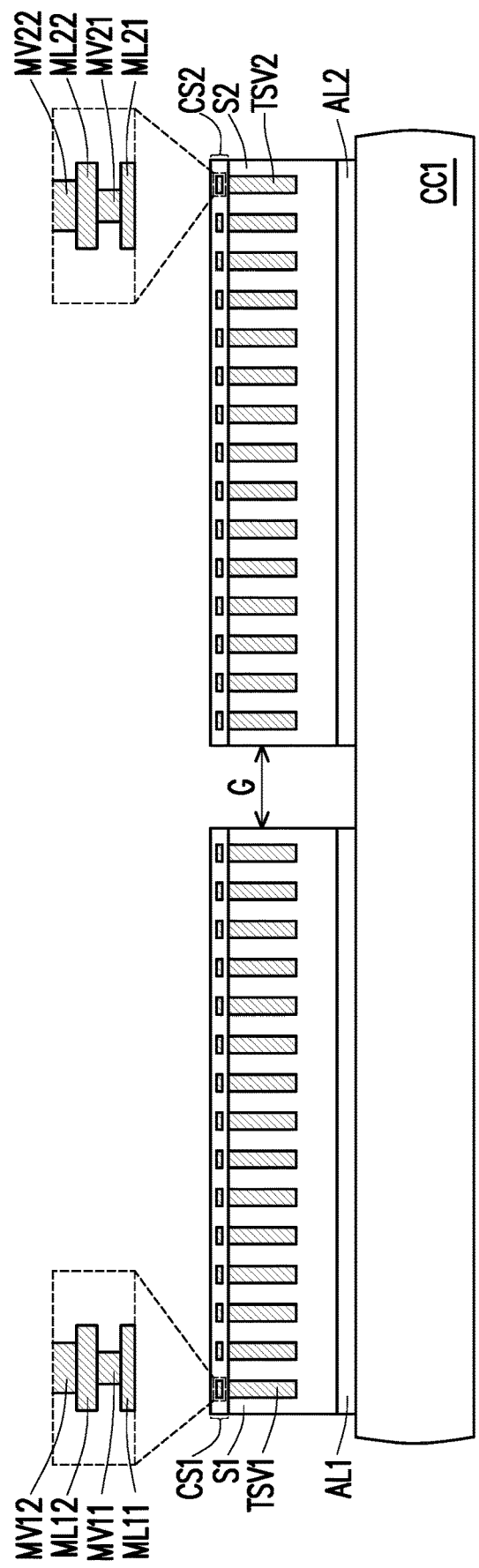
FIG. 1A to FIG. 1S are schematic cross-sectional views of a method of forming a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
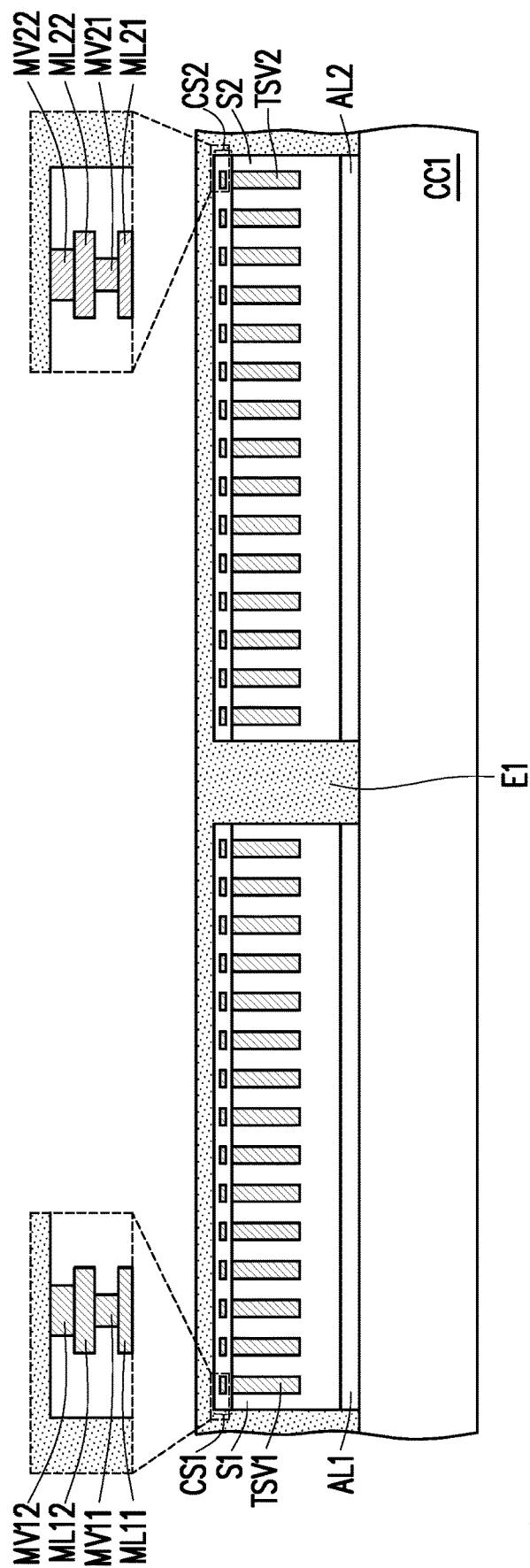
Figure 1C:
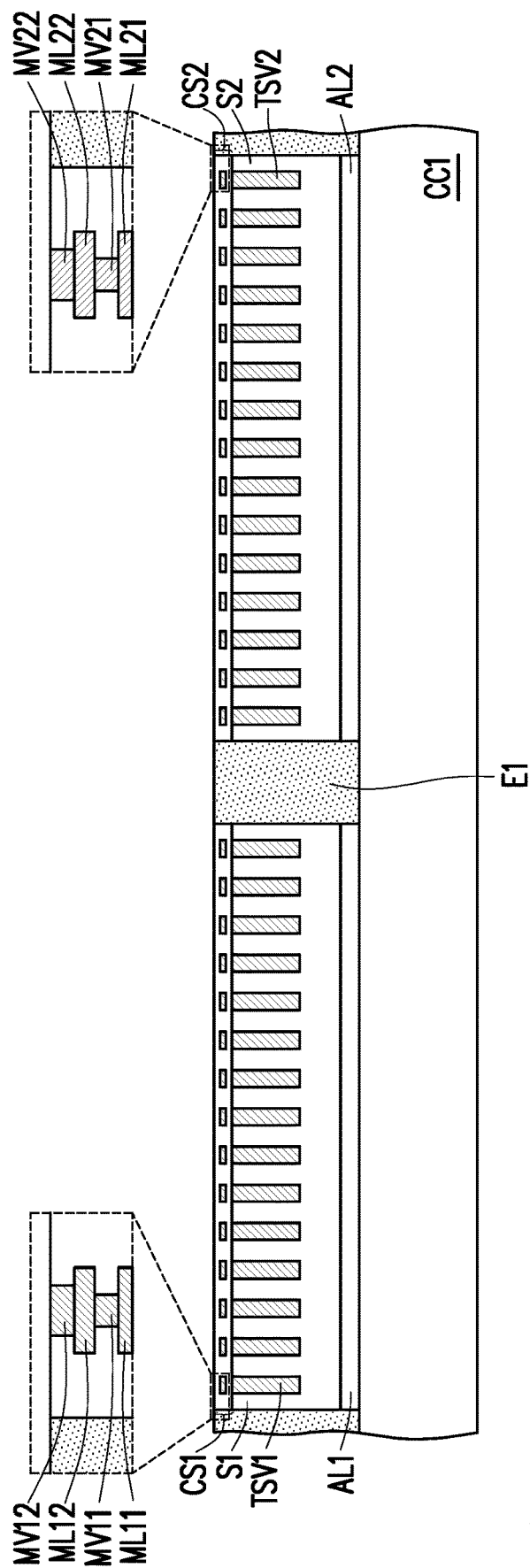
Figure 1D:
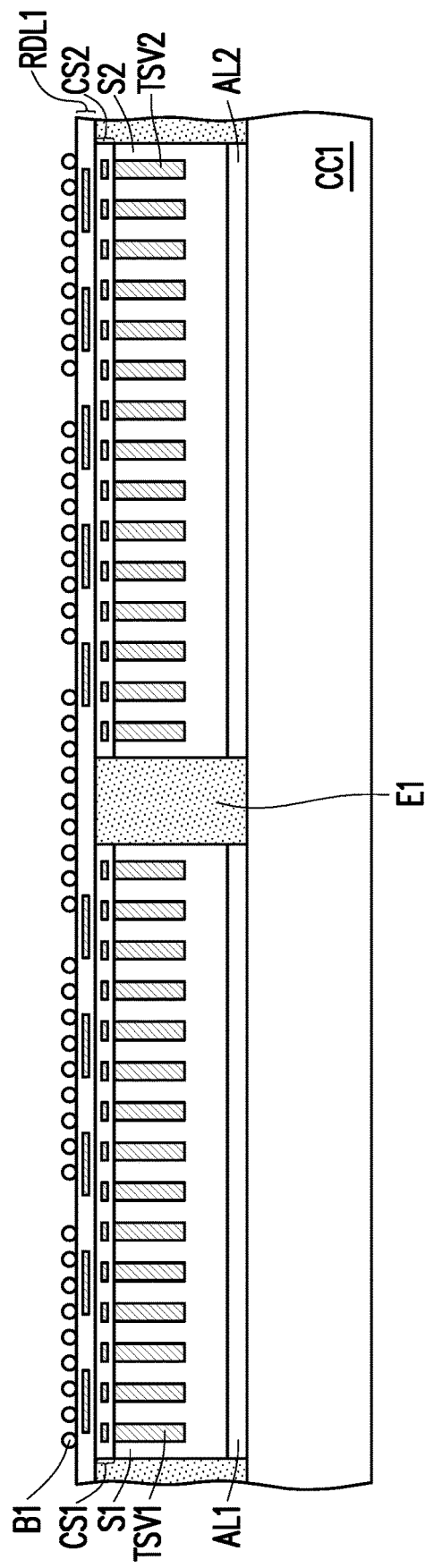
Figure 1E:
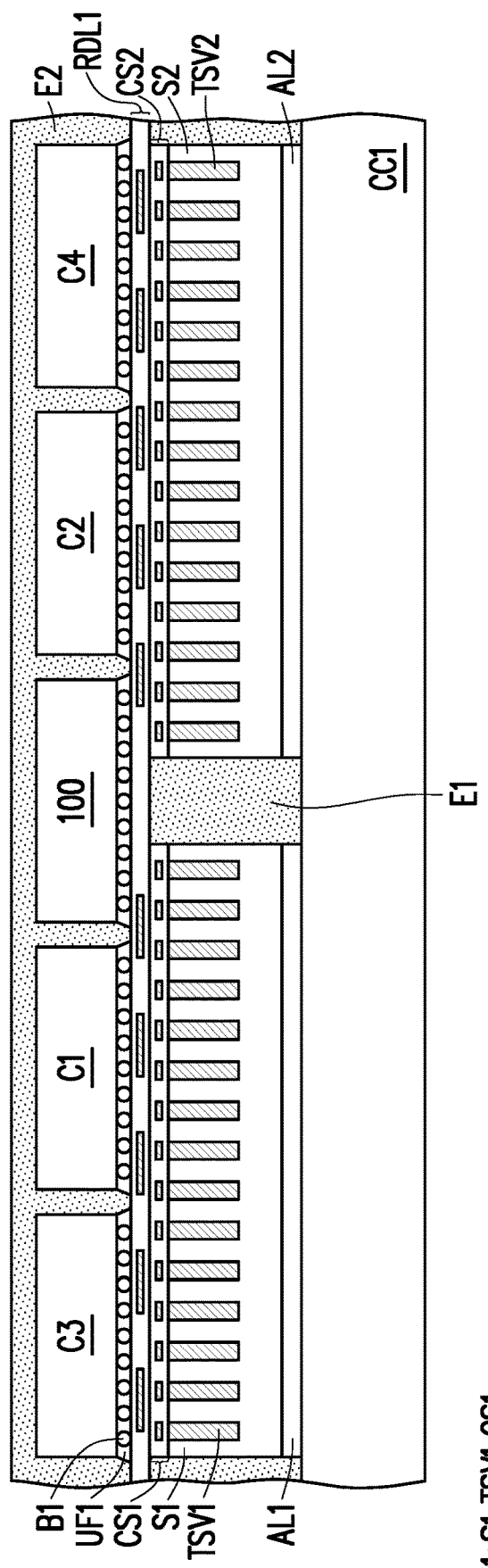
Figure 1F:
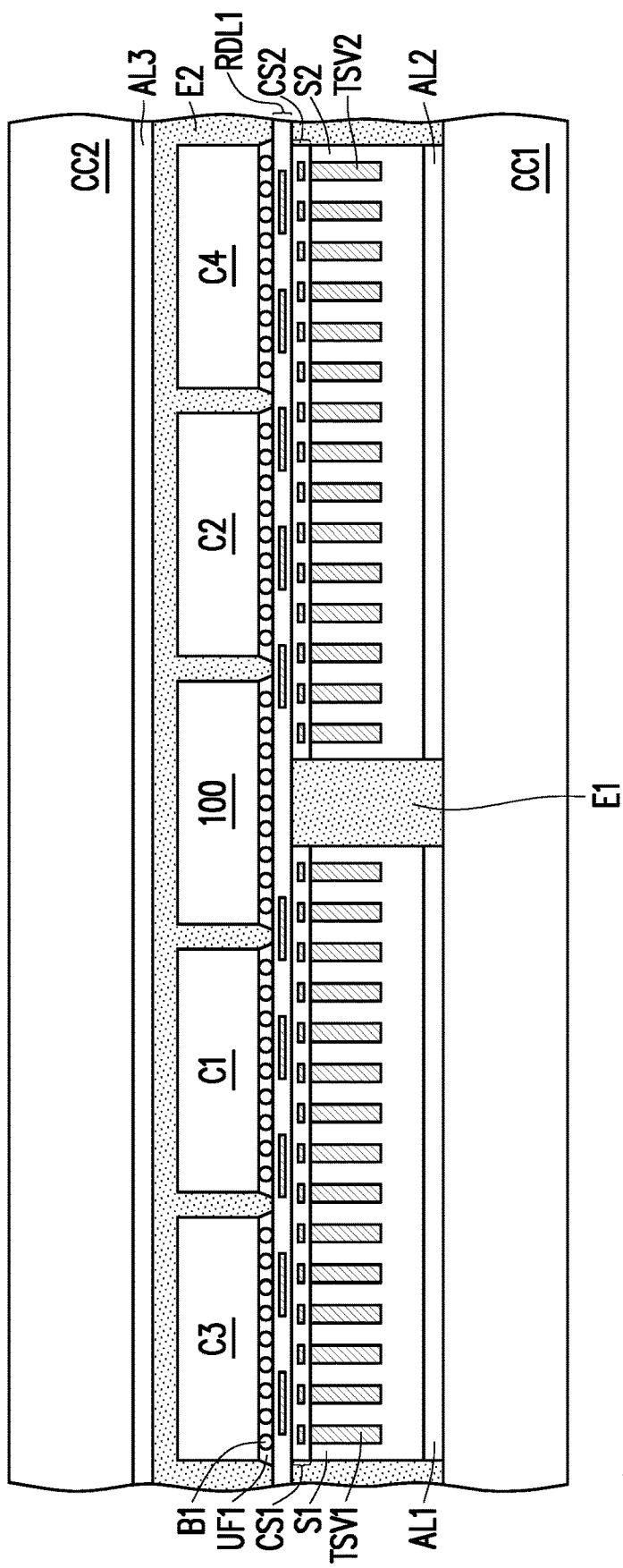
Figure 1G:
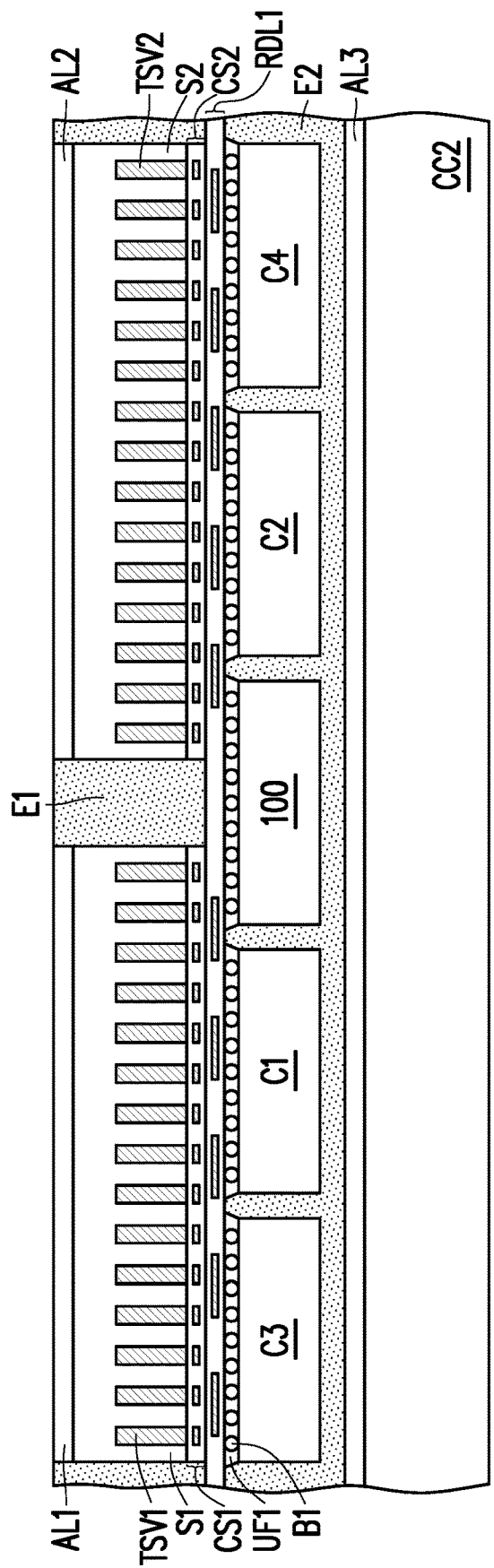
Figure 1H:
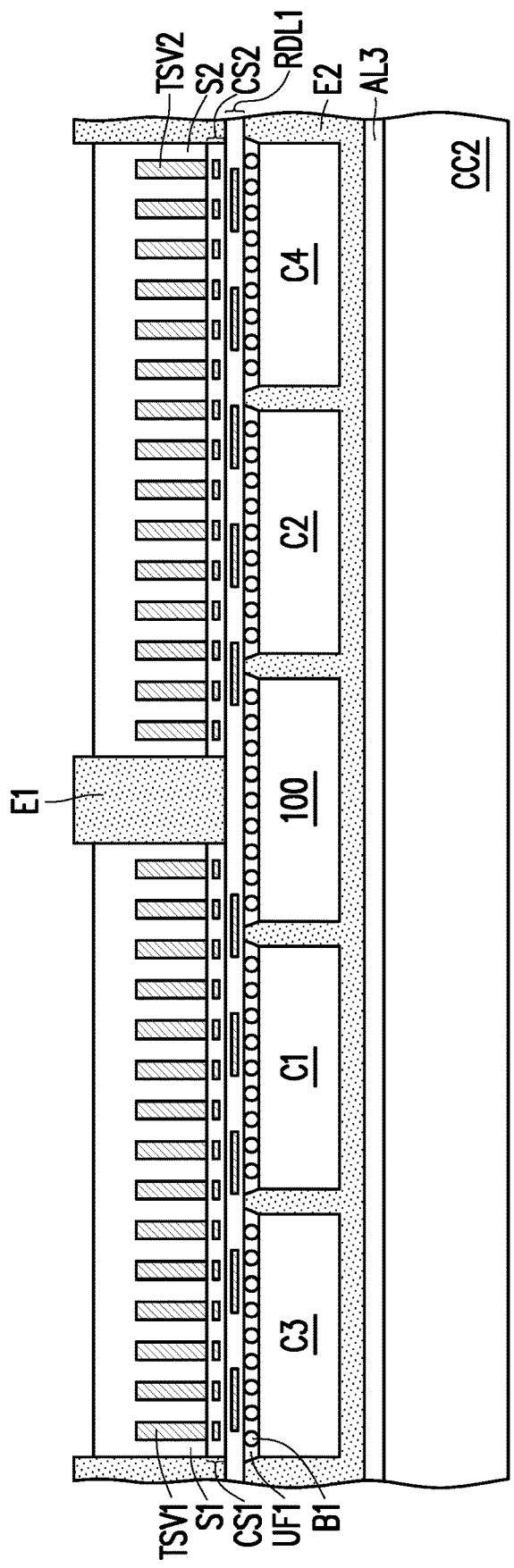
Figure 1I:
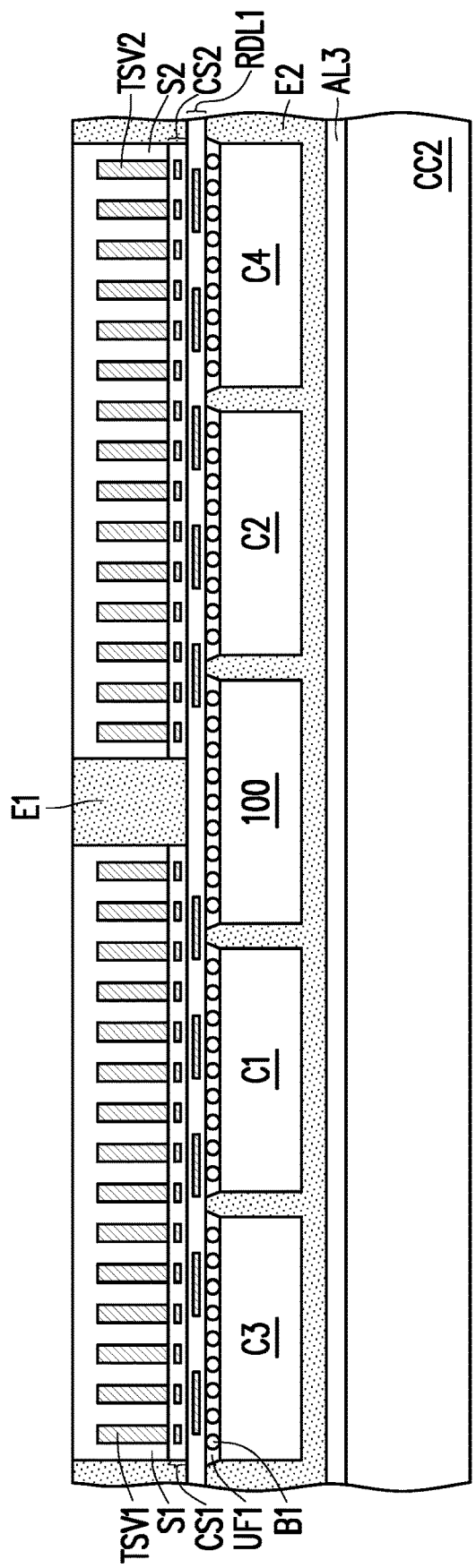
Figure 1J:
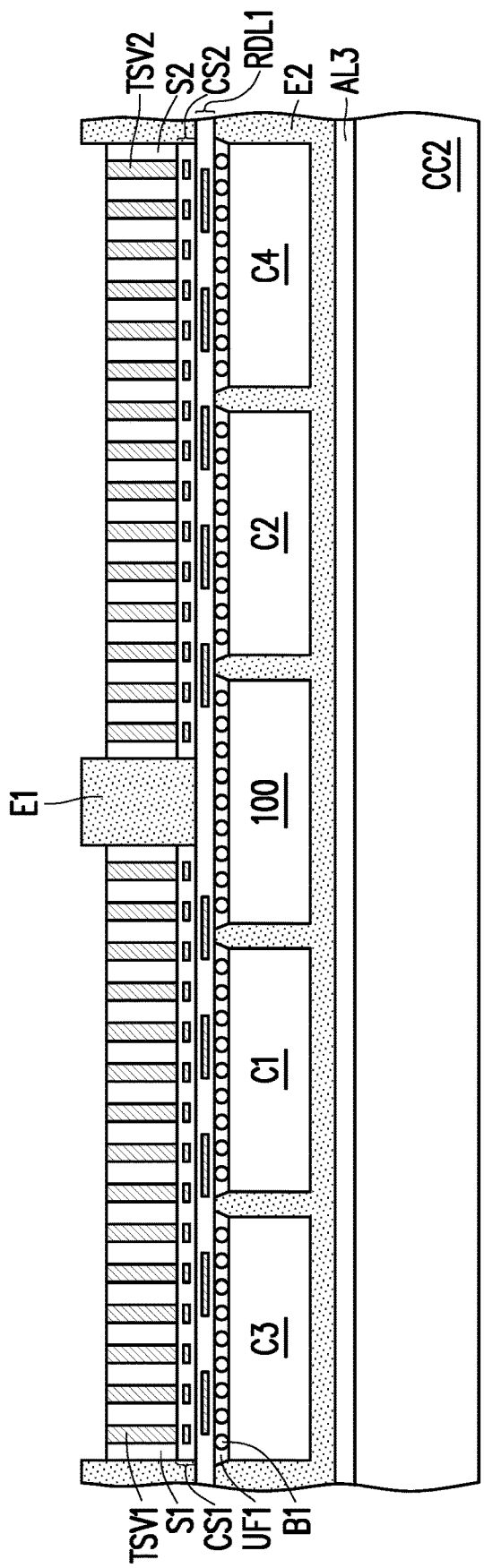
Figure 1K:
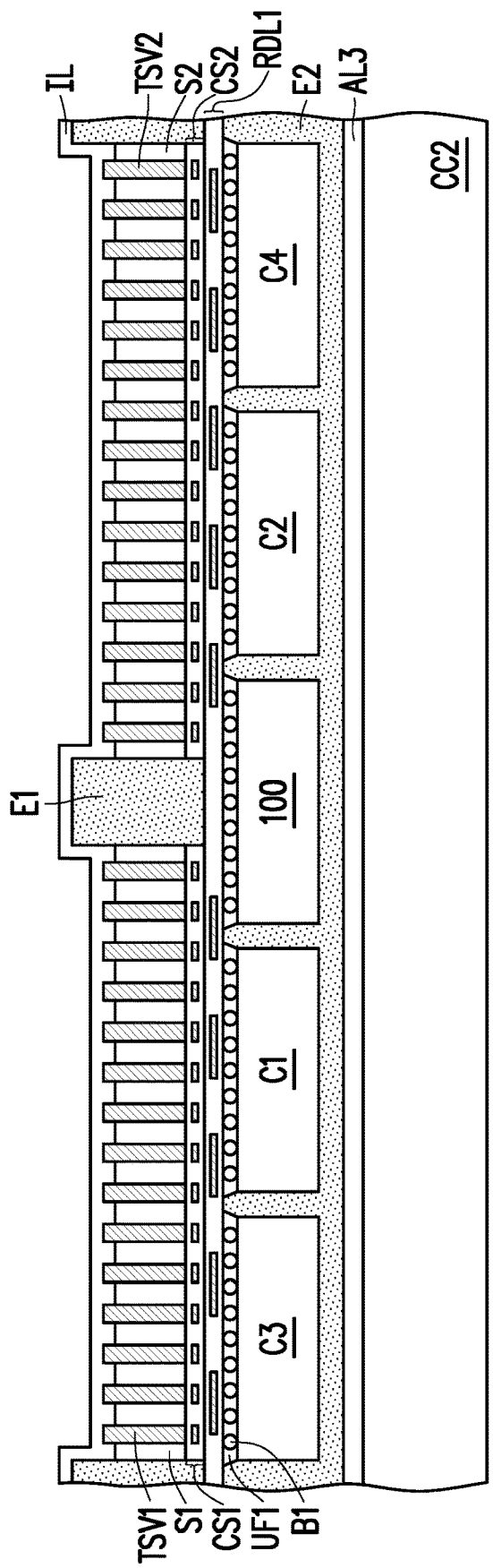
Figure 1L:
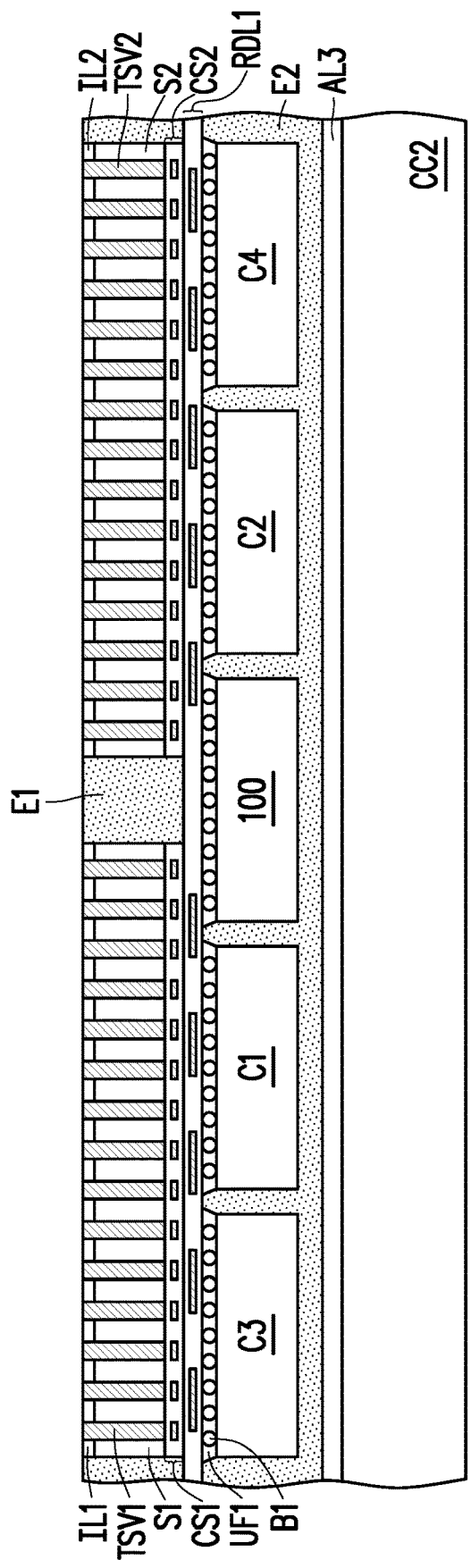
Figure 1M:
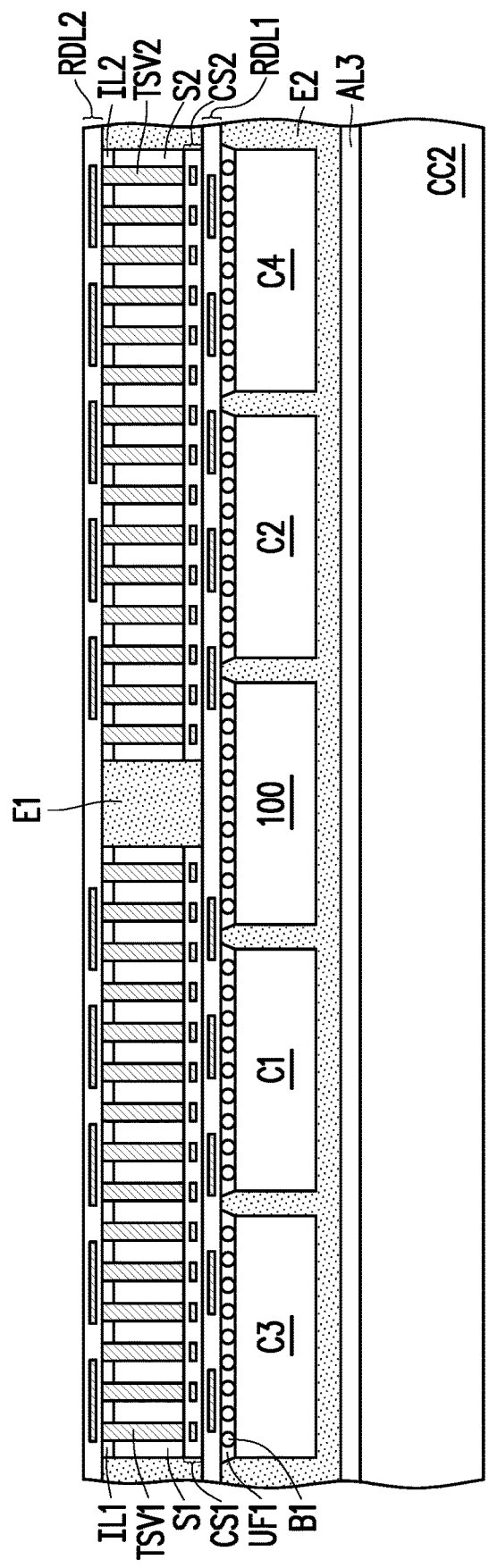
Figure 1N:
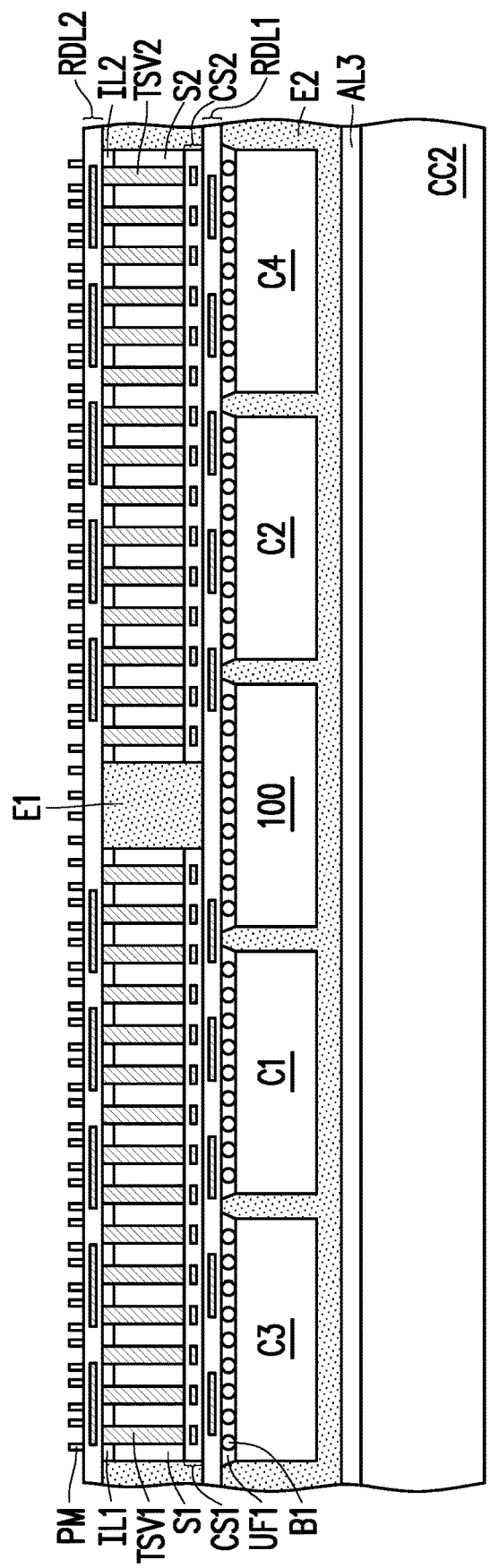
Figure 1P:
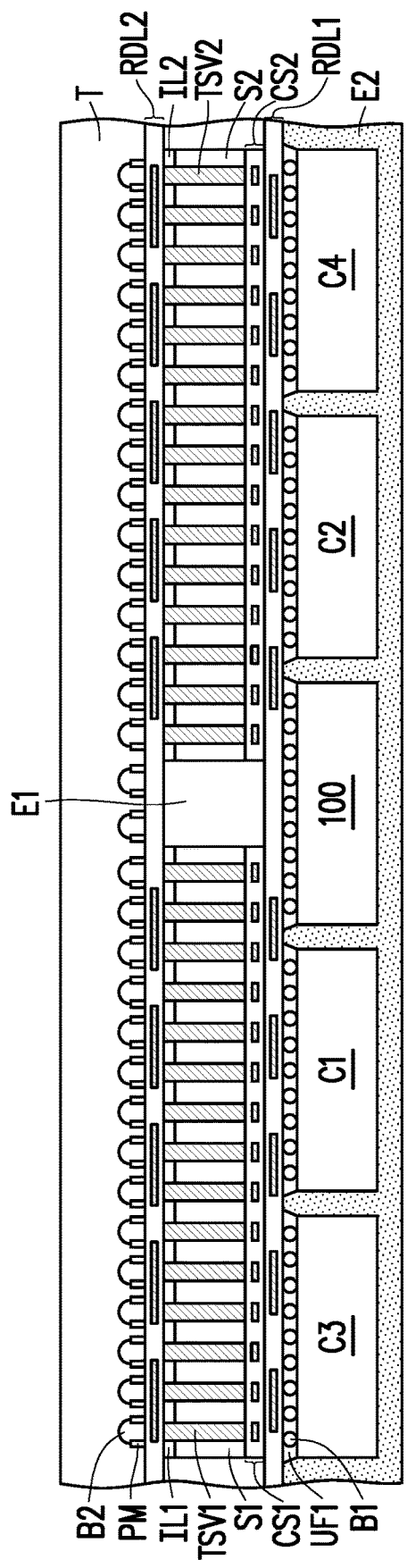
Figure 1Q:
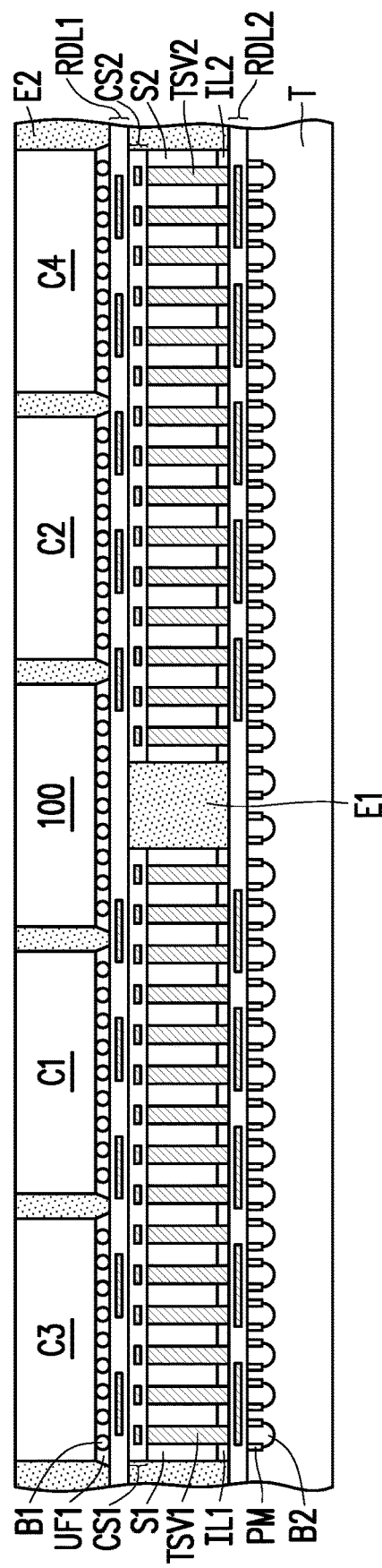
Figure 1R:
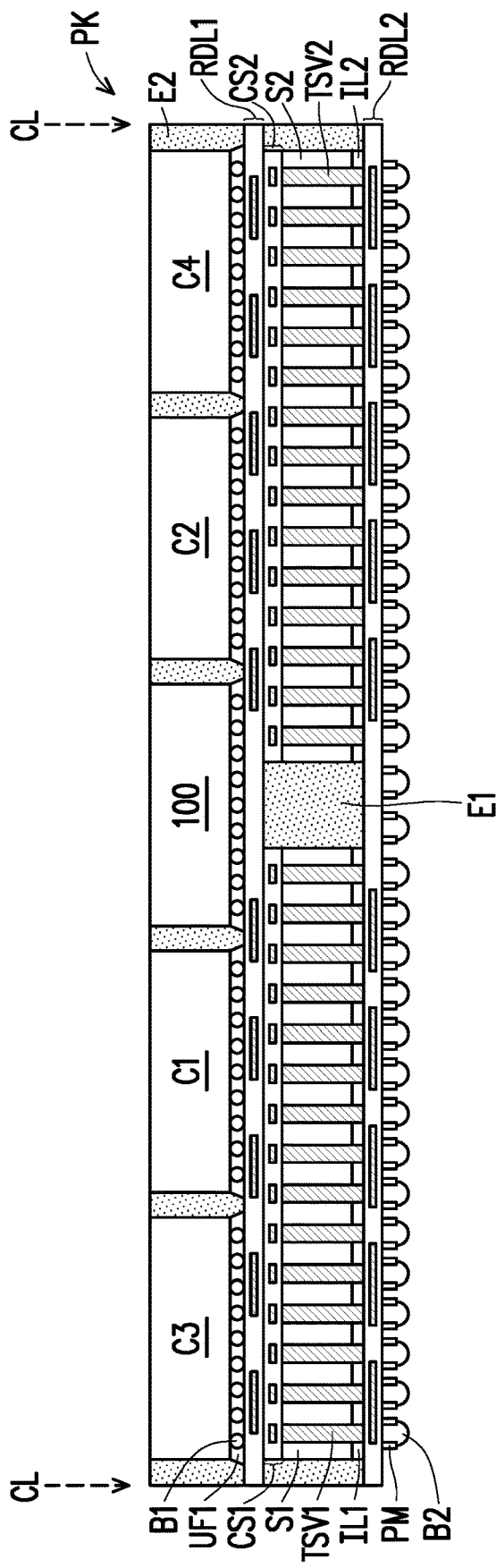

FIG. 1A to FIG. 1R are schematic cross-sectional views of a method of forming a semiconductor package in accordance with some embodiments. It is understood that the disclosure is not limited by the method described below. Additional operations can be provided before, during, and/or after the method and some of the operations described below can be replaced or eliminated, for additional embodiments of the methods.

Figure 1S:
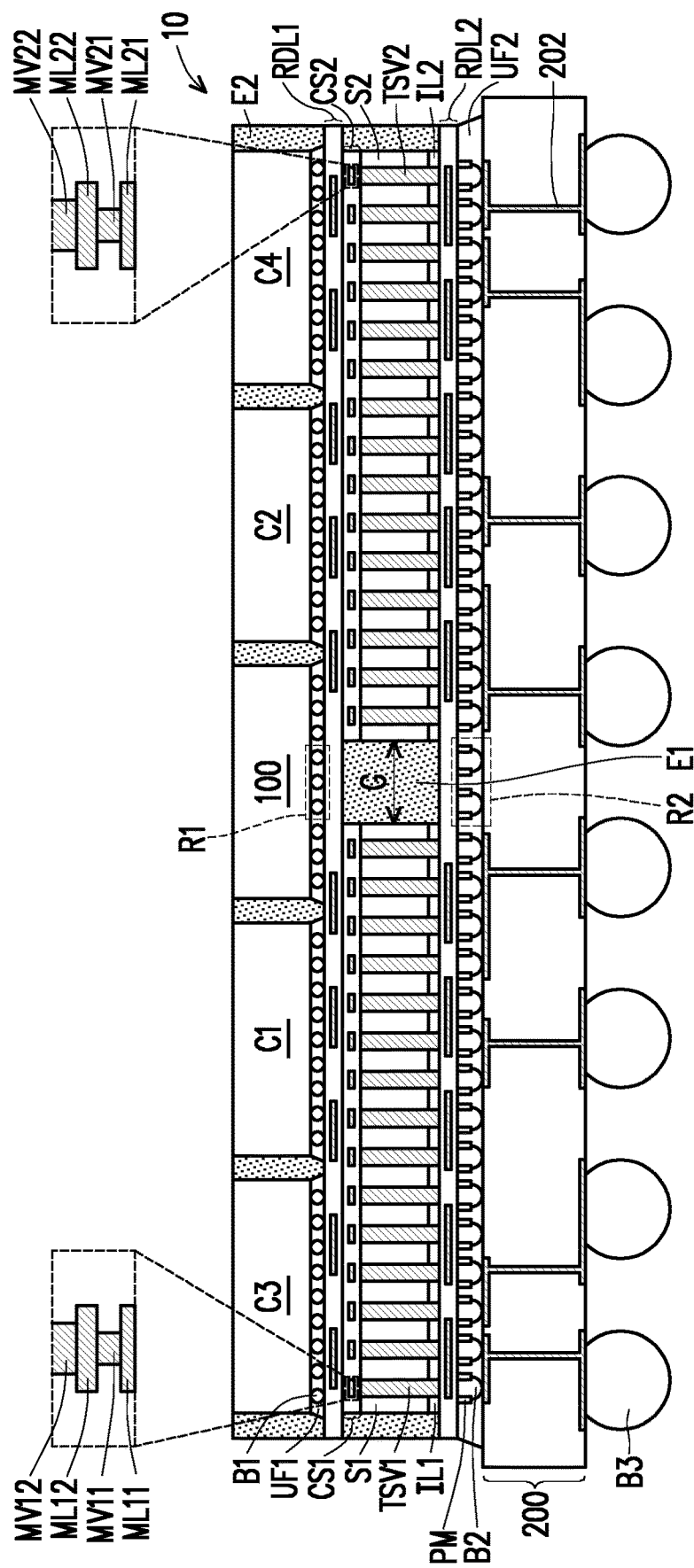

Although FIG. 1A to FIG. 1S are described in relation to a method, it is appreciated that the structures disclosed in FIG. 1A to FIG. 1S are not limited to such a method, but instead may stand alone as structures independent of the method.

Referring to FIG. 1A, a first interposer I1 and a second interposer I2 are attached to a carrier CC1. In some embodiments, the carrier CC1 includes a glass carrier or a suitable carrier. In some embodiments, the first interposer I1 is attached to the carrier CC1 through an adhesive layer AL1, and the second interposer I2 is attached to the carrier CC1 through an adhesive layer AL2. Each of the adhesive layers AL1 and AL2 may include an oxide layer, a die attach tape (DAF) or a suitable adhesive.

In some embodiments, the first interposer I1 includes a first substrate S1, first through substrate vias TSV1 and a first conductive structure CS1. The first substrate S1 may include elementary semiconductor such as silicon, germanium and/or a compound semiconductor such as silicon germanium, silicon carbide, gallium arsenic, indium arsenide, gallium nitride or indium phosphide. The first substrate S1 may be doped as needed. The first through substrate vias TSV1 (also called "first through silicon vias" in some examples) extend from a front side of the first substrate S1 toward a back side of the first substrate S1. The first through substrate vias TSV1 may not penetrate through the first substrate S1 at this stage.

In some embodiments, the first conductive structure CS1 is disposed over the front side of the first substrate S1. The first conductive structure CS1 is simply shown in FIG. 1A, and a partial enlarged view is shown on the left side of FIG. 1A. In some embodiments, the first conductive structure CS1 includes dielectric layers and conductive features embedded by the dielectric layers. The conductive features include metal lines, metal vias, metal pads and/or metal connectors. In some embodiments, each conductive feature includes Cu, Al, Ti, Ta, W, Ru, Co, Ni, the like, or a combination thereof. In some embodiments, a seed layer and/or a barrier layer may be disposed between each conductive feature and the adjacent polymer layer. The seed layer may include Ti/Cu. The barrier layer may include Ta, TaN, Ti, TiN, CoW or a combination thereof. In some embodiments, each dielectric layer includes silicon oxide, silicon nitride, silicon oxynitirde, SiOC, the like, or a combination thereof. An etching stop layer may be interposed between two adjacent dielectric layers. The dielectric layers of the first conductive structure CS1 may be replaced by polymer layers or insulating layers as needed. In some embodiments, each polymer layer includes a photo-sensitive material such as polybenzoxazole (PBO), polyimide (PI), benzocyclobutene (BCB), the like, or a combination thereof. In some embodiments, the critical dimension of the first conductive structure CS1 close to the first substrate S1 is different from (e.g., less than) the critical dimension of the first conductive structure CS1 away from the first substrate S1. Specifically, the width of the metal line ML11 (or metal via MV11) of the first conductive structure CS1 close to the first substrate S1 is different from (e.g., less than) the width of the metal line ML12 (or metal via MV12) of the first conductive structure CS1 away from the first substrate S1. The metal vias MV22 and MV12 are referred to as zeroth copper vias in some examples. In some embodiments, the metal vias MV22 and MV12 are the topmost vias, and a dielectric layer may cover the metal vias MV22 and MV12.

In some embodiments, the first interposer I1 is an active interposer that contains at least one functional device or integrated circuit device included in the first conductive structure CS1. Such active interposer is referred to as a "device-containing interposer" in some examples. In some embodiments, the functional device includes an active device, a passive device, or a combination thereof. The functional device includes, for example but not limited to, transistors, capacitors, resistors, diodes, photodiodes, fuse devices and/or other similar components. In some embodiments, the functional device includes a gate dielectric layer, a gate electrode, source/drain regions, spacers, and the like.

In other embodiments, the first interposer I1 is a passive interposer, which is used to convey a lack of a functional device or integrated circuit device. Such passive interposer is referred to as a "device-free interposer" in some examples.

In some embodiments, the second interposer I2 includes a second substrate S2, second through substrate vias TSV2 and a second conductive structure CS2. The second substrate S2, the second through substrate vias TSV2 and the second conductive structure CS2 of the second interposer I2 may be similar to the first substrate S1, the first through substrate vias TSV1 and the first conductive structure CS1, so the materials and configurations of these elements may refer to those of the first interposer I1, and the details are not iterated herein.

The second through substrate vias TSV2 (also called "second through silicon vias" in some examples) extend from a front side of the second substrate S2 toward a back side of the second substrate S2. The second through substrate vias TSV2 may not penetrate through the second substrate S2 at this stage. In some embodiments, the second conductive structure CS2 is disposed over the front side of the second substrate S2. The second conductive structure CS2 is simply shown in FIG. 1A, and a partial enlarged view is shown on the right side of FIG. 1A. In some embodiments, the critical dimension of the second conductive structure CS2 close to the second substrate S2 is different from (e.g., less than) the critical dimension of the second conductive structure CS2 away from the second substrate S2. Specifically, the width of the metal line ML21 (or metal via MV21) of the second conductive structure CS2 close to the second substrate S2 is different from (e.g., less than) the width of the metal line ML22 (or metal via MV22) of the second conductive structure CS2 away from the second substrate S2.

In some embodiments, the second interposer I2 is an active interposer that contains at least one functional device or integrated circuit device included in the second conductive structure CS2. In other embodiments, the second interposer I2 is a passive interposer, which is used to convey a lack of a functional device or integrated circuit device.

In some embodiments, the first interposer I1 and the second interposer I2 are both active interposers. In other embodiments, the first interposer I1 and the second interposer I2 are both passive interposers. In other embodiments, one of the first interposer I1 and the second interposer I2 is an active interposer, and the other of the first interposer I1 and the second interposer I2 is a passive interposer. Besides, the critical dimension of the first interposer I1 may be similar to or different from the critical dimension of the second interposer I2 upon the design requirements.

In some embodiments, the gap width G between the first interposer I1 and the second interposer I2 is no more than about 150 um. For example, the gap width G between the first interposer I1 and the second interposer I2 ranges from about 50 um to 150 um. Other value or range of the gap width G may be applicable upon the process requirements.

Referring to FIG. 1B, a first dielectric encapsulation E1 is formed around the first interposer I1 and the second interposer I2. Specifically, the first dielectric encapsulation E1 fills the gap between the first interposer I1 and the second interposer I2 and covers the sidewalls and tops of the first interposer I1 and the second interposer I2. As shown in the enlarged views of FIG. 1B, the first dielectric encapsulation E1 covers the top of the first conductive structure CS1 and the top of the second conductive structure CS2. In some embodiments, the first dielectric encapsulation E1 includes a molding compound, a molding underfill, a resin or the like. In some embodiments, the first dielectric encapsulation E1 includes a polymer material such as polybenzoxazole (PBO), polyimide, benzocyclobutene (BCB), the like, or a combination thereof. The first dielectric encapsulation E1 may be formed by a molding process followed by a curing process.

Referring to FIG. 1C, a grinding process is performed to the first dielectric encapsulation E1. In some embodiments, the top surface of the first dielectric encapsulation E1 is substantially coplanar with the top surfaces of the first and second interposers I1 and I2 upon the grinding process. As shown in the enlarged views of FIG. 1C, the top surfaces of the metal vias MV12 and MV22 are exposed upon the grinding process. In some embodiments, the grinding process may remove the dielectric layer over the metal vias MV12 and MV22 until the metal vias MV12 and MV22 are exposed.

Referring to FIG. 1D, a first redistribution layer structure RDL1 is formed over the first dielectric encapsulation E1, the first interposer I1 and the second interposer I2. The first redistribution layer structure RDL1 is referred to as a "front-side redistribution layer structure" in some examples. In some embodiments, the first redistribution layer structure RDL1 is electrically connected to the first conductive structure CS1 of the first interposer I1 and the second conductive structure CS2 of the second interposer I2. In some embodiments, the first redistribution layer structure RDL1 includes redistribution layers embedded by polymer layers. The redistribution layers include metal lines, metal vias, metal pads and/or metal connectors. In some embodiments, each redistribution layer includes Cu, Al, Ti, Ta, W, Ru, Co, Ni, the like, or a combination thereof. In some embodiments, a seed layer and/or a barrier layer may be disposed between each redistribution layer and the adjacent polymer layer. The seed layer may include Ti/Cu. The barrier layer may include Ta, TaN, Ti, TiN, CoW or a combination thereof. In some embodiments, each polymer layer includes a photo-sensitive material such as polybenzoxazole (PBO), polyimide (PI), benzocyclobutene (BCB), the like, or a combination thereof. The polymer layers of the first redistribution layer structure RDL1 may be replaced by dielectric layers or insulating layers as needed.

Afterwards, bumps B1 are formed over and electrically connected to the first redistribution layer structure RDL1. In some embodiments, the bumps B1 include solder bumps, and/or may include metal pillars (e.g., copper pillars), solder caps formed on metal pillars, and/or the like. The bumps B1 are referred to as "micro bumps" in some examples. The bumps B1 may be formed by a suitable process such as evaporation, electroplating, ball drop, or screen printing.

Referring to FIG. 1E, at least one first die C1, at least one second die C2, at least one third die C3, at least one fourth die C4 and at least one bridge structure 100 are formed on and electrically connected to the first redistribution layer structure RDL1 through the bumps B1.

The first die C1 may include a logic die, a memory die, a CPU, a GPU, an xPU, a MEMS die, a SoC die, or the like. The first die C1 may include various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. The adjacent first dies C1 may have the same or different functions.

The second die C2 may include a logic die, a memory die, a CPU, a GPU, an xPU, a MEMS die, a SoC die, or the like. The second die C2 may include various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. The adjacent second die C2 may have the same or different functions.

In some embodiments, the first die C1 and the second die C2 have similar function. In other embodiments, the first die C1 and the second die C2 have different functions. Besides, upon the process requirements, the dimension of the first die C1 may be similar to or different from the dimension of the second die C2. The dimension may be a height, a width, a size, a top-view area or a combination thereof.

The third die C3 may include a memory die or a memory stack such as High Bandwidth Memory (HBM) cube. The memory chips in the memory stack may have the same or different heights.

The fourth die C4 may include a memory die or a memory stack such as High Bandwidth Memory (HBM) cube. The memory chips in the memory stack may have the same or different heights.

Besides, upon the process requirements, the dimension of the third die C3 may be similar to or different from the dimension of the fourth die C4. The dimension may be a height, a width, a size, a top-view area or a combination thereof.

The bridge structure 100 is formed over the first redistribution layer structure RDL1 and between the first die C and the second die C2. In some embodiments, the bridge structure 100 is formed across the first dielectric encapsulation E1 between the first interposer I1 and the second interposer I2. In some embodiments, the bridge structure 100 may be placed such that the first die C, the second die C2, the third die C3 and the fourth die C4 surround the bridge structure 100. In other words, the bridge structure 100, the first die C, the second die C2, the third die C3 and the fourth die C4 are located at a same level. In some embodiments, from the top view, the bridge structure 100 is partially overlapped with at least one of the first interposer I1 and the second interposer I2.

The bridge structure 100 provides electrical routing between different interposers, dies or die stacks. The bridge structure 100 may include routing patterns disposed on/in a semiconductor substrate such as a silicon substrate. The routing patterns includes through substrate vias, lines, vias, pads and/or connectors. The bridge structure 100 is referred to as a "connection structure", "bridge die" or "silicon bridge" in some examples.

In some embodiments, the bridge structure 100 is free of active devices (e.g. transistors or the like) and/or passive devices (e.g., resistors, capacitors, inductors, or the like). For example, the bridge structure 100 may solely include routing patterns for signal transmission without serving other functions. Such bridge structure 100 is referred to as a "device-free die" in some examples. However, the disclosure is not limited thereto. In alternative embodiments, the bridge structure 100 may include active devices and/or passive devices to perform functions other than signal transmission.

Still referring to FIG. 1E, a first underfill layer UF1 is formed to fill the space between the first redistribution layer structure RDL1 and each of first die C1, the second die C2, the third die C3, the fourth die C4 and the bridge structure 100, and surrounds the bumps B1. In some embodiments, the first underfill layer UF1 includes a molding compound such as epoxy, and is formed using dispensing, injecting, and/or spraying process.

Thereafter, a second dielectric encapsulation E2 is formed around the first die C, the second die C2, the third die C3, the fourth die C4 and the bridge structure 100. Specifically, the second dielectric encapsulation E2 fills the gaps between the neighboring dies and between the bridge structure 100 and the adjacent die, and covers the sidewalls and tops of the first die C, the second die C2, the third die C3, the fourth die C4 and the bridge structure 100. In some embodiments, the second dielectric encapsulation E2 includes a molding compound, a molding underfill, a resin or the like. In some embodiments, the second dielectric encapsulation E2 includes a polymer material such as polybenzoxazole (PBO), polyimide, benzocyclobutene (BCB), the like, or a combination thereof. The second dielectric encapsulation E2 may be formed by a molding process followed by a curing process.

Referring to FIG. 1F, a carrier CC2 is attached to the second dielectric encapsulation E2. In some embodiments, the carrier CC2 includes a glass carrier or a suitable carrier. In some embodiments, the carrier CC2 is attached to the second dielectric encapsulation E2 through an adhesive layer AL3. The adhesive layer AL3 may include an oxide layer, a die attach tape (DAF) or a suitable adhesive.

Referring to FIG. 1G, the structure of FIG. 1F is flipped over, and the carrier CC1 is debonded from the structure of FIG. 1F. In one embodiment, the debonding process is a laser debonding process or a suitable process.

Referring to FIG. 1H, the adhesive layer AL1 and the adhesive layer AL2 are removed from the first interposer I1 and the second interposer I2, respectively. In some embodiments, the removing process is an etching process and/or a cleaning process. In some embodiments, upon the removing process of FIG. 1H, the surface of the first dielectric encapsulation E1 is higher than the back sides of the first and second interposers I1 and I2.

Referring to FIG. 1I, a grinding process is performed to the first dielectric encapsulation E1, the first interposer I1 and the second interposer I2. In some embodiments, the first dielectric encapsulation E1, the first substrate S1 of the first interposer I1 and the second substrate S2 of the second interposer I2 are thinned by the grinding process. In some embodiments, upon the grinding process of FIG. 1I, the surface of the first dielectric encapsulation E1 is substantially as high as the back sides of the first and second interposers I1 and I2.

Referring to FIG. 1J, a polishing process is performed to the first interposer I1 and the second interposer I2, until the first through substrate vias TSV1 and the second through substrate vias TSV2 are exposed. In some embodiments, a chemical mechanical polishing (CMP) process is performed to the first substrate S1 of the first interposer I1 and the second substrate S2 of the second interposer I2 by using the first through substrate vias TSV1 and the second through substrate vias TSV2 as polishing stop layers. In some embodiments, upon the polishing process of FIG. 1J, the surface of the first dielectric encapsulation E1 is higher than the back sides of the first and second interposers I1 and I2.

Referring to FIG. 1K, a recessing process is performed to the first substrate S1 of the first interposer I1 and the second substrate S2 of the second interposer I2, until the surfaces of the first substrate S1 and the second substrate S2 are recessed with respect to the surfaces of the first through substrate vias TSV1 and the second through substrate vias TSV2. Specifically, the bottom portions of the first through substrate vias TSV1 and the second through substrate vias TSV2 are exposed by the first substrate S1 and the second substrate S2, respectively. In some embodiments, the recessing process includes an etching back process or a suitable process.

Thereafter, an insulating layer IL is conformally formed over the first interposer I1, the second interposer I2 and the first dielectric encapsulation E1. In some embodiments, the insulating layer IL includes a polymer material, such as polybenzoxazole (PBO), polyimide (PI) or the like. In other embodiments, the insulating layer IL includes an inorganic material, such as silicon oxide, silicon nitride, silicon oxynitride, or any suitable dielectric material.

Referring to FIG. 1L, a grinding process and a polishing process are performed to the insulating layer IL and the first dielectric encapsulation E1, until the first through substrate vias TSV1 and the second through substrate vias TSV2 are exposed. In some embodiments, a wheel grinding process is performed to the insulating layer IL and the first dielectric encapsulation E1, and a chemical mechanical polishing (CMP) process is then performed to the same by using the first through substrate vias TSV1 and the second through substrate vias TSV2 as polishing stop layers. In some embodiments, upon the grinding and polishing processes of FIG. 1L, the surface of the first dielectric encapsulation E1 is substantially coplanar with the surfaces of the first through substrate vias TSV1, the surfaces of the second through substrate vias TSV2, the surface of the first insulating layer IL1 and the surface of the second insulating layer IL2. Specifically, the bottom portions of the first through substrate vias TSV1 are surrounded by the first insulating layer IL1, and the bottom portions of the second through substrate vias TSV2 are surrounded by the second insulating layer IL2. In some embodiments, the first insulating layer IL2 is regarded as part of the first interposer I1, and the second insulating layer IL2 is regarded as part of the second interposer IL2.

Referring to FIG. 1M, a second redistribution layer structure RDL2 is formed over the first dielectric encapsulation E1, the first interposer I1 and the second interposer I2. The second redistribution layer structure RDL2 is referred to as a "back-side redistribution layer structure" in some examples. The second redistribution layer structure RDL2 is electrically connected to the first through substrate vias TSV1 of the first interposer I1 and the second through substrate vias TSV2 of the second interposer I2. In some embodiments, the second redistribution layer structure RDL2 includes redistribution layers embedded by polymer layers. The redistribution layers include metal lines, metal vias, metal pads and/or metal connectors. In some embodiments, each redistribution layer includes Cu, Al, Ti, Ta, W, Ru, Co, Ni, the like, or a combination thereof. In some embodiments, a seed layer and/or a barrier layer may be disposed between each redistribution layer and the adjacent polymer layer. The seed layer may include Ti/Cu. The barrier layer may include Ta, TaN, Ti, TiN, CoW or a combination thereof. In some embodiments, each polymer layer includes a photo-sensitive material such as polybenzoxazole (PBO), polyimide (PI), benzocyclobutene (BCB), the like, or a combination thereof. The polymer layers of the second redistribution layer structure RDL2 may be replaced by dielectric layers or insulating layers as needed.

In some embodiments, the critical dimension of the second redistribution layer structure RDL2 is different from (e.g., greater than) the critical dimension of the first redistribution layer structure RDL1. Specifically, the width of the metal lines, metal vias, metal pads or metal connectors of the second redistribution layer structure RDL2 is different from (e.g., greater than) the width of the metal lines, metal vias, metal pads or metal connectors of the first redistribution layer structure RDL1.

Referring to FIG. 1N, polymer patterns PM are formed over the second redistribution layer RDL2. In some embodiments, each polymer pattern includes a photo-sensitive material such as polybenzoxazole (PBO), polyimide (PI), benzocyclobutene (BCB), the like, or a combination thereof. In some embodiments, the polymer patterns PM are multiple separate ring patterns.

Referring to FIG. 1O, bumps B2 are formed over and electrically connected to the second redistribution layer structure RDL2. In some embodiments, each bump B2 is disposed within and in physical contact with the corresponding polymer pattern PM. In some embodiments, the bumps B2 include solder bumps, and/or may include metal pillars (e.g., copper pillars), solder caps formed on metal pillars, and/or the like. The bumps B2 are referred to as "controlled collapse chip connection (C4) bumps" in some examples. The bumps B2 may be formed by a suitable process such as evaporation, electroplating, ball drop, or screen printing.

Referring to FIG. 1P, a wafer tape T is attached to the second redistribution layer structure RDL2 and the bumps B2. In some embodiments, the wafer tape T includes PVC, polyolefin, polyethylene, or other suitable materials.

Thereafter, the carrier CC2 is debonded from the second dielectric encapsulation E2. In one embodiment, the debonding process is a laser debonding process or a suitable process. The adhesive layer AL3 is then removed from the second dielectric encapsulation E2. In some embodiments, the removing process is an etching process and/or a cleaning process.

Referring to FIG. 1Q, the structure of FIG. 1P is flipped over, and a grinding process is performed to the second dielectric encapsulation E2. In some embodiments, upon the grinding process of FIG. 1Q, the top surface of the second dielectric encapsulation E2 is substantially coplanar with the top surfaces of first die C1, the second die C2, the third die C3, the fourth die C4 and the bridge die 100.

Referring to FIG. 1S, a wafer dicing process is performed on the structure of FIG. 1Q along the cutting lines CL, so as to cut through the second dielectric encapsulation E2, the first redistribution layer structure RDL1, the first dielectric encapsulation E1 and the second redistribution layer structure RDL2. After the wafer dicing process or singulation process, the adjacent semiconductor packages PK are separated from each other.

Referring to FIG. 1S, a board substrate 200 is formed below and electrically connected to the second redistribution layer structure RDL2. In some embodiments, the board substrate 200 is bonded to the second redistribution layer structure RDL2 through the bumps B2.

In some embodiments, the board substrate 200 includes a core layer and two build-up layers on opposite sides of the core layer. In some embodiments, the core layer includes prepreg (which contains epoxy, resin, and/or glass fiber), polyimide, photo image dielectric (PID), the like, or a combination thereof. In some embodiments, the build-up layers include prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), the like, or a combination thereof. The material of the core layer may be different from the material of the build-up layers. In some embodiments, the board substrate 200 includes wiring patterns 202 that penetrate through the core layer and the build-up layers for providing electrical routing between different interposers, dies or die stacks. The wiring patterns 202 include lines, vias, pads and/or connectors. The board substrate 200 is referred to as a "printed circuit board (PCB)" in some examples. In other embodiments, the core layer of the board substrate 200 may be omitted as needed, and such board substrate 200 is referred to as a "coreless board substrate".

Thereafter, a second underfill layer UF2 is formed to fill the space between the second redistribution layer structure RDL2 and the board substrate 200, and surrounds the bumps B2. In some embodiments, the second underfill layer UF2 includes a molding compound such as epoxy, and is formed using dispensing, injecting, and/or spraying process.

Afterwards, bumps B3 are formed below and electrically connected to the board substrate 200. In some embodiments, each bump B3 is electrically to the wiring patterns 202 of the board substrate 200. In some embodiments, the bumps B3 include solder bumps, and/or may include metal pillars (e.g., copper pillars), solder caps formed on metal pillars, and/or the like. The bumps B3 are referred to as "ball grid array (BGA) balls" in some examples. The bumps B3 may be formed by a suitable process such as evaporation, electroplating, ball drop, or screen printing. In some embodiments, the semiconductor package 10 of the disclosure is thus completed.

Figure 2:
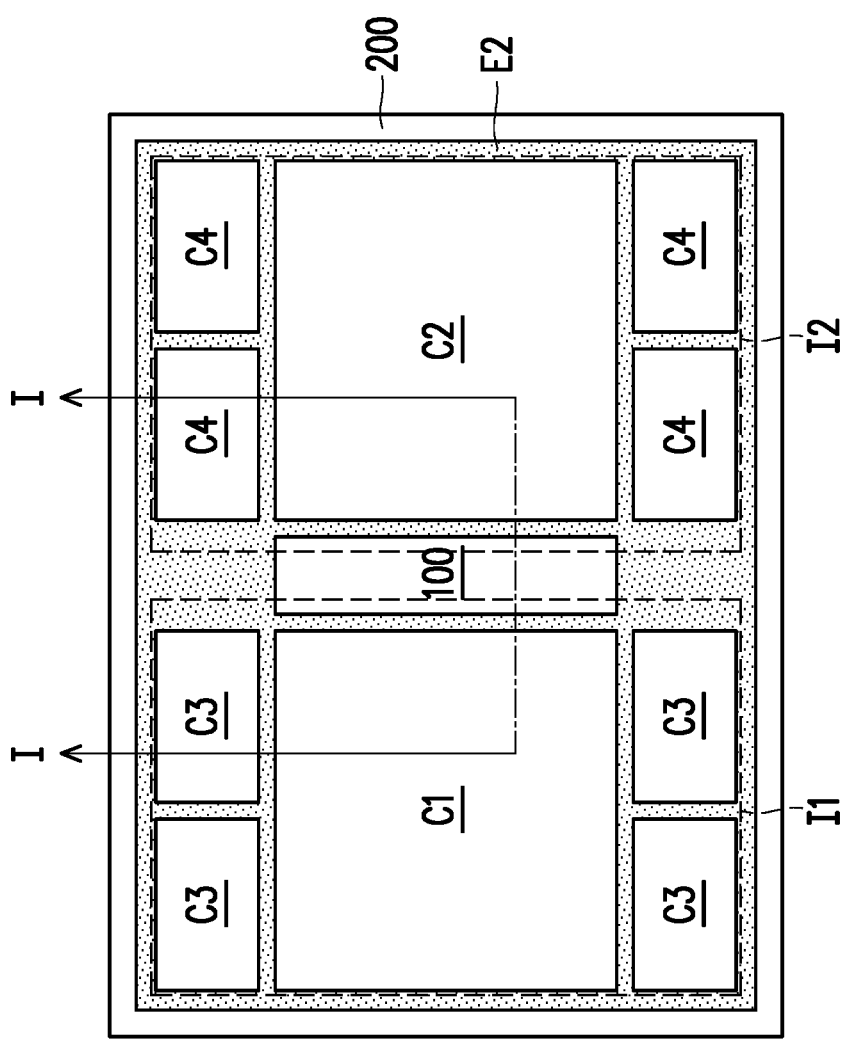
FIG. 2 to FIG. 5 are schematic top views of semiconductor packages in accordance with some embodiments.

FIG. 2 is a schematic top view of a semiconductor package in accordance with some embodiments. For simplicity and clarity of illustration, only few elements are shown in the top view of FIG. 2. In some embodiments, FIG. 1S is a cross-sectional view of a semiconductor package along the line I-I of FIG. 2.

Referring to FIG. 1S and FIG. 2, a semiconductor package 10 includes a first interposer I1 and a second interposer I2 embedded by a first dielectric encapsulation E1. The semiconductor package 10 further includes a first die C1 disposed over and electrically connected to the first interposer I1, and a second die C2 disposed over and electrically connected to the second interposer I2. The semiconductor package 10 further includes a bridge structure 100 disposed over and partially overlapped with the first interposer I1 and the second interposer I2. The bridge structure is disposed between the first die C1 and the second die C2. In some embodiments, the semiconductor package 10 further includes a plurality of third dies C3 disposed over the first interposer I1 and aside the first die C1, and a plurality of fourth dies C4 disposed over the second interposer I2 and aside the second die C2. In some embodiments, the third dies C3 are at two sides of the first die C1, and the fourth dies C4 are at two sides of the second die C2. In some embodiments, the semiconductor package 10 further includes a board substrate 200 disposed below the first interposer I1 and the second interposer I2.

For a larger reticle size CoWoS process, particles on the reticle would be a yield killer. In some embodiments of the disclosure, the interposers are provided as chiplets with a smaller size, and semiconductor dies are provided over the interposers and electrically connected to each other through at least one bridge structure between the semiconductor dies and the underlying interposers. By such manner, the production yield can be significantly improved. In some embodiments, since the interposers of the disclosure are chiplets instead of the conventional single bulk interposer, the semiconductor package of the disclosure is called a "chip on fan-out on substrate (CoFoS)" structure.

The top-view configuration of the FIG. 2 may be modified as needed. Several examples are provided below for illustration purposes, and are not to be construed as limiting the scope of the present disclosure. It is appreciated by people having ordinary skill in the art that other top-view configurations of the semiconductor packages are possible.

Figure 3:
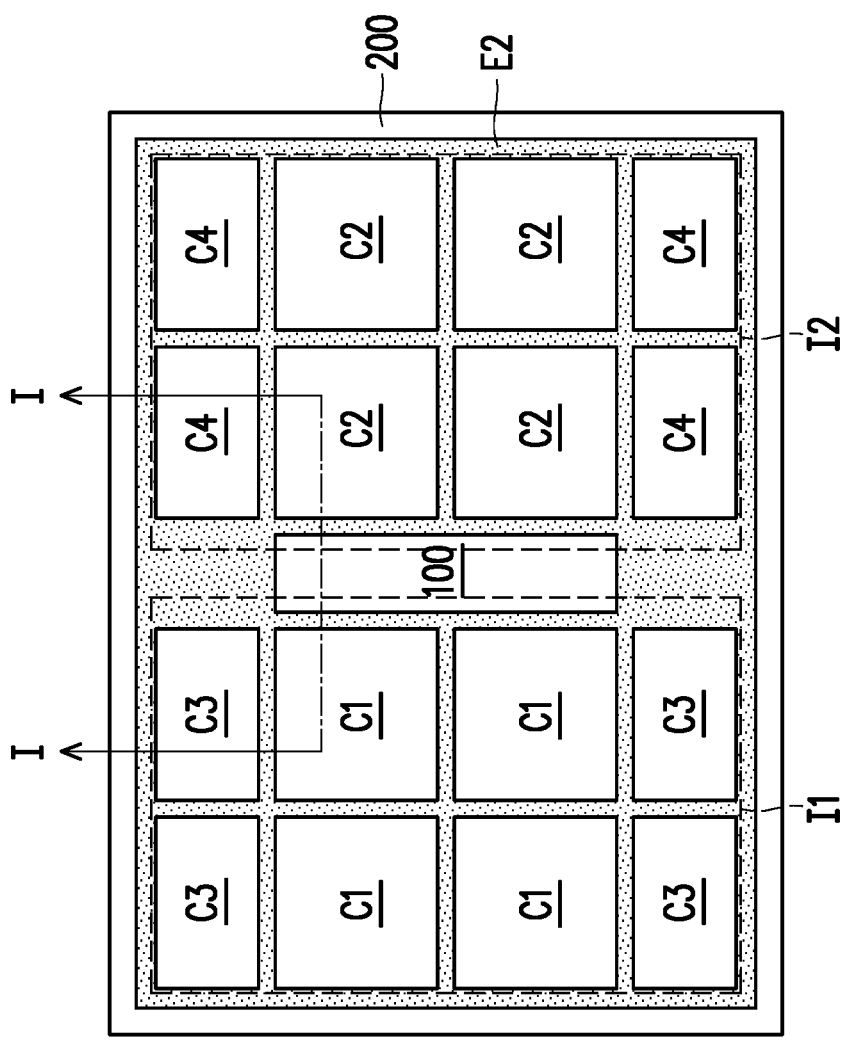

In some embodiments, as shown in FIG. 3, four first dies C1 are provided at one side of one bridge structure 100, and four second dies C2 are provided at another side of the same bridge structure 100. In some embodiments, FIG. 1S is a cross-sectional view of a semiconductor package along the line I-I of FIG. 3.

Figure 4:
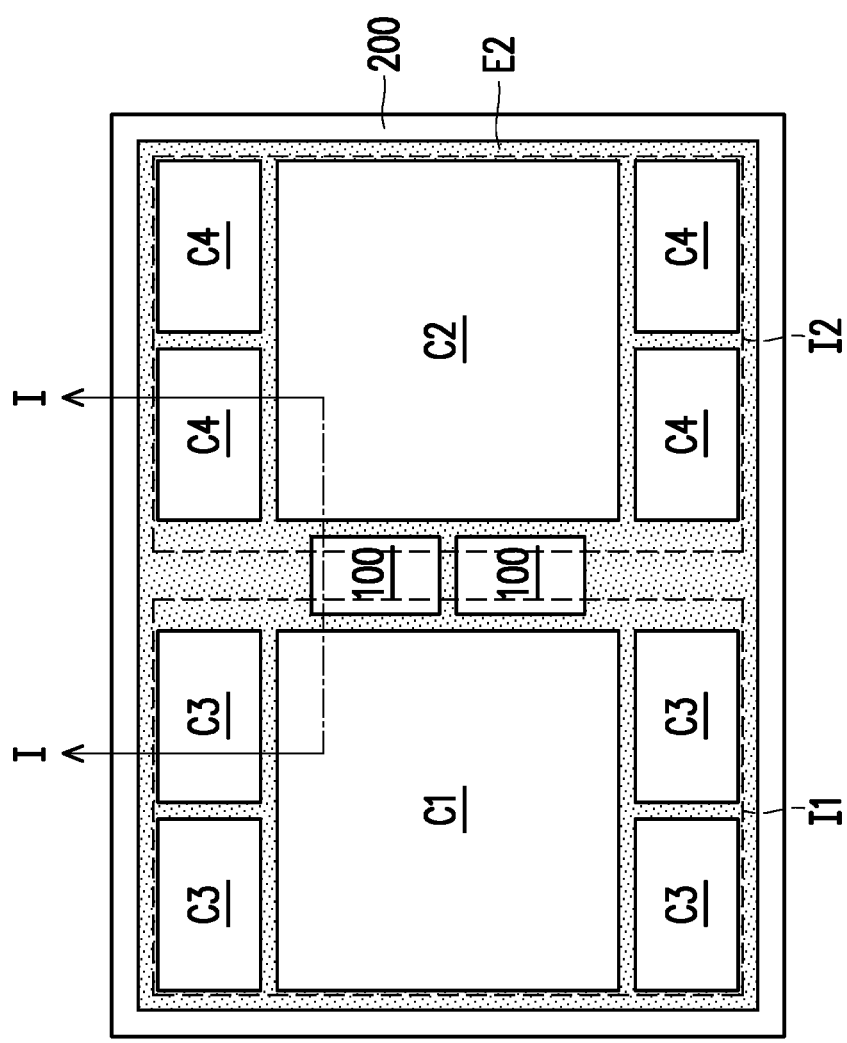

In some embodiments, as shown in FIG. 4, one first die C1 is provided at one side of two bridge structures 100, and one second die C2 is provided at another side of the same bridge structures 100. In some embodiments, FIG. 1S is a cross-sectional view of a semiconductor package along the line I-I of FIG. 4.

Figure 5:
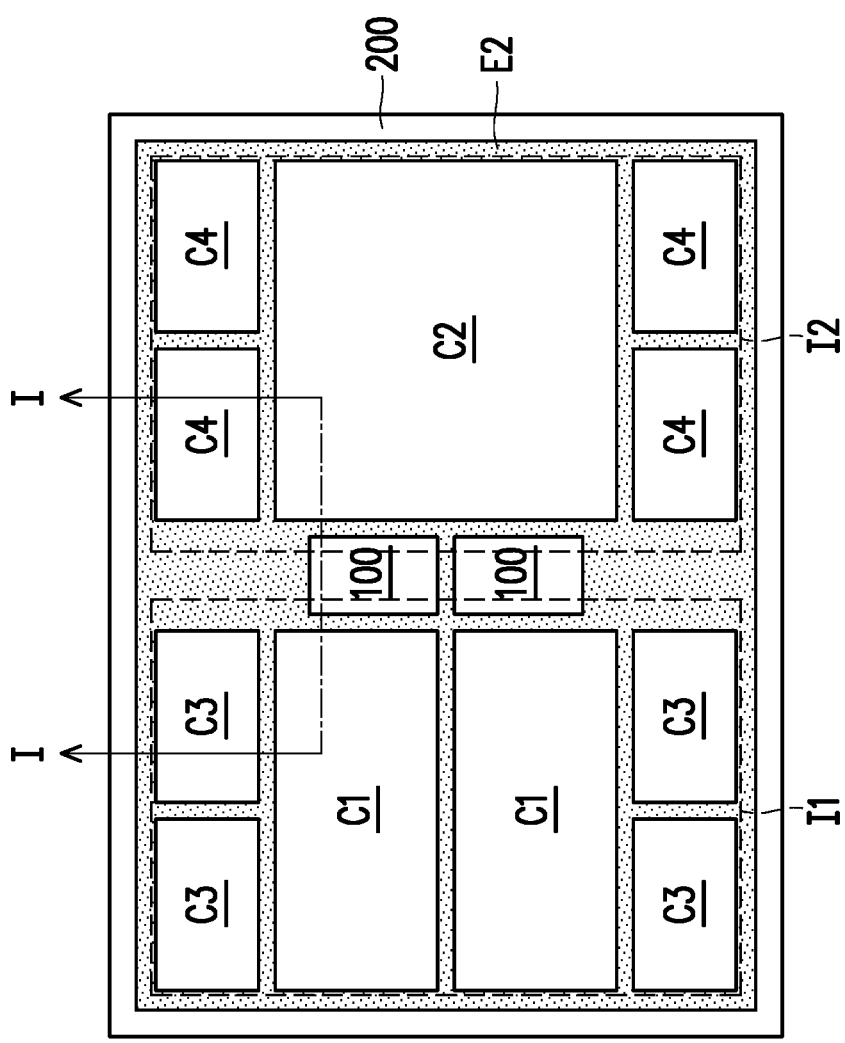

In some embodiments, as shown in FIG. 5, two first dies C1 are provided at one side of two bridge structures 100, and one second die C2 is provided at another side of the same bridge structures 100. In some embodiments, FIG. 1S is a cross-sectional view of a semiconductor package along the line I-I of FIG. 5.

In view of the above, the number of the bridge structure(s) and the numbers of the semiconductor dies at two sides of the bridge structure(s) may be adjusted upon the process requirements. Besides, the numbers of semiconductor dies (e.g., first to fourth dies) at two sides of the bridge structure (s) may be the same or different upon the process requirements. In some embodiments, the border of the bridge structure is substantially aligned with the border of the adjacent semiconductor dies, as shown in FIG. 2 and FIG. 3. In other embodiments, the border of the bridge structure is not aligned with the border of the adjacent semiconductor dies, as shown in FIG. 4 and FIG. 5. For example, the border of the bridge structure may be recessed with respect to the border of the adjacent semiconductor dies. Alternatively, at least a portion of the bridge structure may extend beyond the border of the adjacent semiconductor dies.

Figure 6:
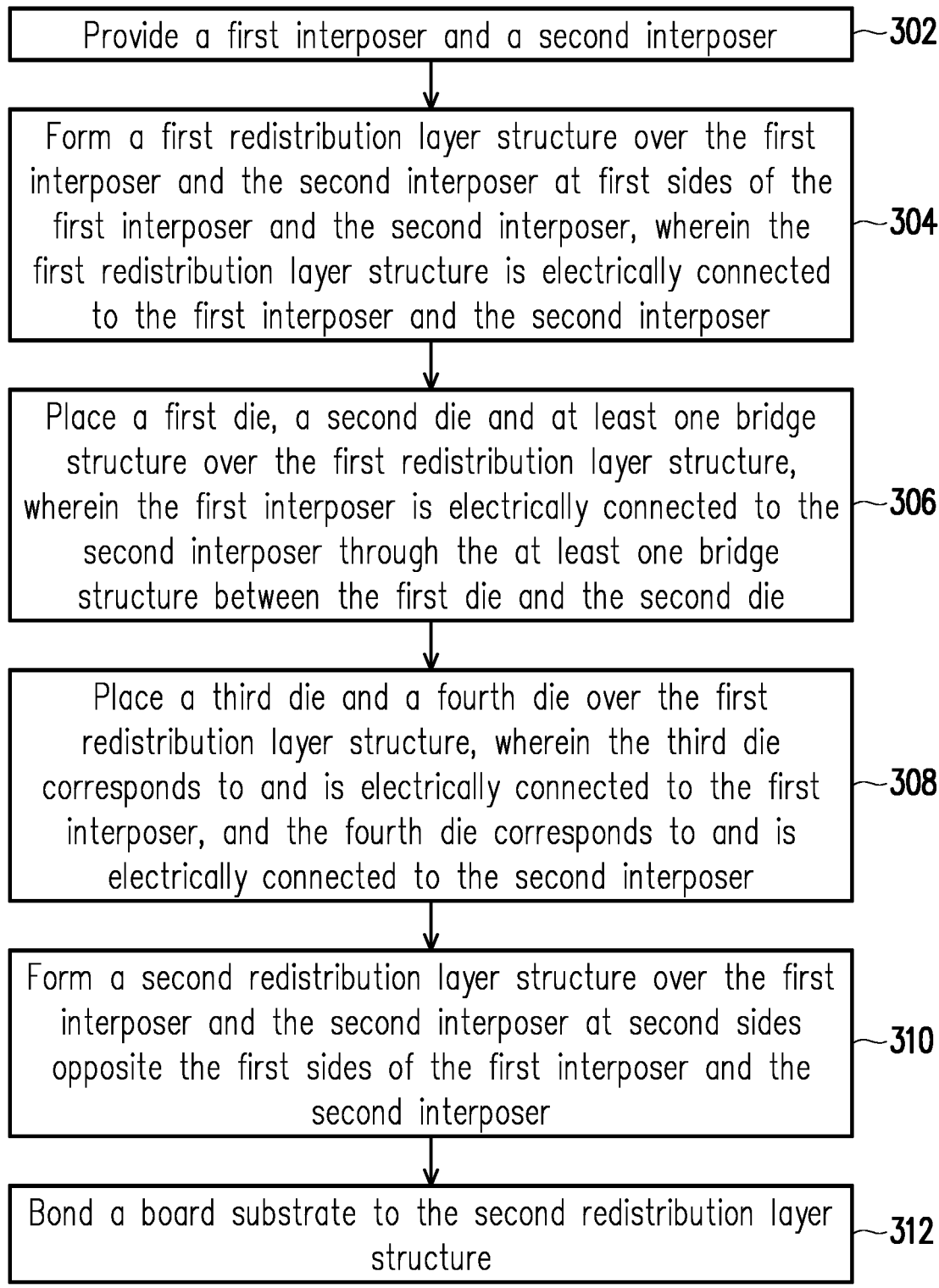
FIG. 6 illustrates a method of forming a semiconductor package in accordance with some embodiments.

FIG. 6 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a first interposer and a second interposer are provided. FIG. 1A illustrates a cross-sectional view corresponding to some embodiments of act 302.

At act 304, a first redistribution layer structure is formed over the first interposer and the second interposer at first sides of the first interposer and the second interposer, wherein the first redistribution layer structure is electrically connected to the first interposer and the second interposer. In some embodiments, the first sides are front sides of the first interposer and the second interposer. FIG. 1B to FIG. 1D illustrate cross-sectional views corresponding to some embodiments of act 304.

At act 306, a first die, a second die and at least one bridge structure are placed over the first redistribution layer structure, wherein the first interposer is electrically connected to the second interposer through the at least one bridge structure between the first die and the second die. FIG. 1E illustrates a cross-sectional view corresponding to some embodiments of act 306. The sequence of placing the first die, the second die and the at least one bridge structure is not limited by the disclosure. In some embodiments, the first die corresponds to and is electrically connected to the first interposer, and the second die corresponds to and is electrically connected to the second interposer.

At act 308, a third die and a fourth die are placed over the first redistribution layer structure, wherein the third die corresponds to and is electrically connected to the first interposer, and the fourth die corresponds to and is electrically connected to the second interposer. FIG. 1E illustrates a cross-sectional view corresponding to some embodiments of act 308. In some embodiments, the third die and the first die provide different functions and are located at the same side, and the fourth die and the second die provide different functions and are located at the same side. The sequence of placing the third die and the fourth die is not limited by the disclosure. Besides, the sequence of act 306 and act 308 may be exchanged as needed. In some embodiments, act 308 is optional, and may be omitted as needed.

At act 310, a second redistribution layer structure is formed over the first interposer and the second interposer at second sides opposite to the first sides of the first interposer and the second interposer. In some embodiments, the second sides are back sides of the first interposer and the second interposer. FIG. 1F to FIG. 1M illustrate cross-sectional views corresponding to some embodiments of act 310.

At 312, a board substrate is bonded to the second redistribution layer structure. FIG. 1N to FIG. 1S illustrate cross-sectional views corresponding to some embodiments of act 312.

The semiconductor package of FIG. 1S may be modified upon the process requirements. FIG. 7 to FIG. 10 are cross-sectional views of various semiconductor packages in accordance with alternative embodiments. The semiconductor packages of FIG. 7 to FIG. 10 are beneficial for cost reduction and/or size reduction. The difference between them is described in details below, and the similarity is not iterated herein.

Figure 7:
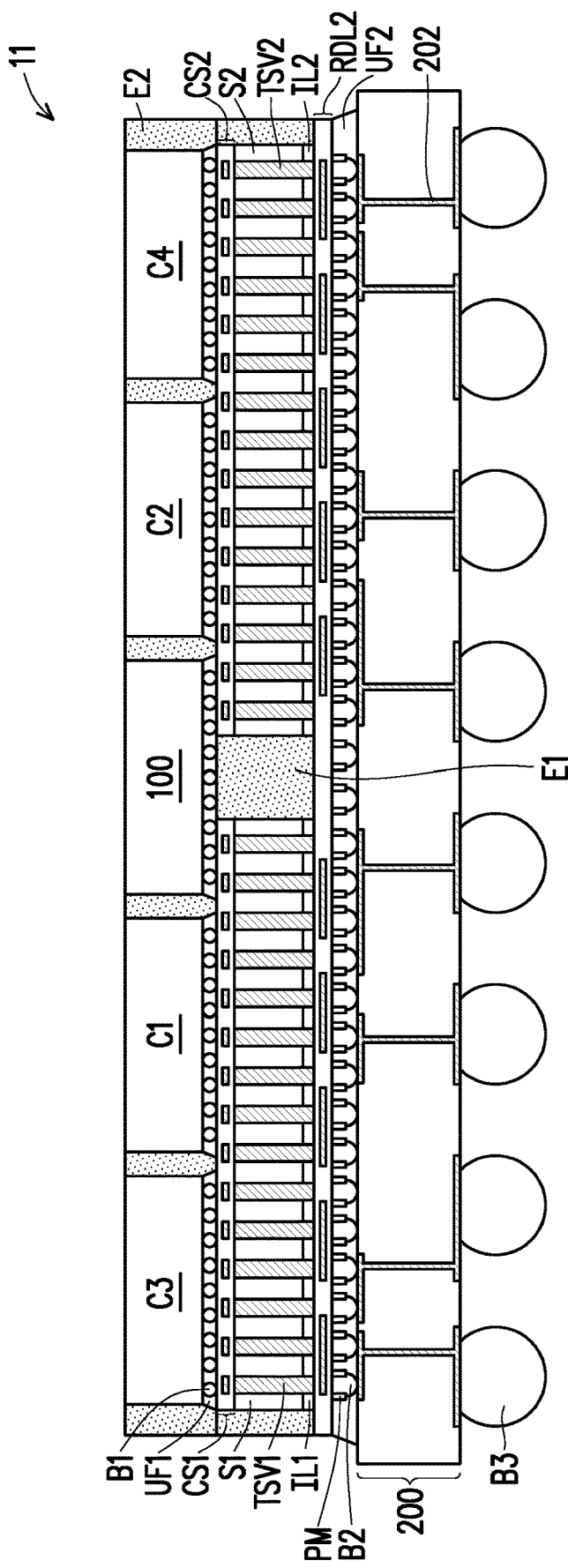
Figure 15:
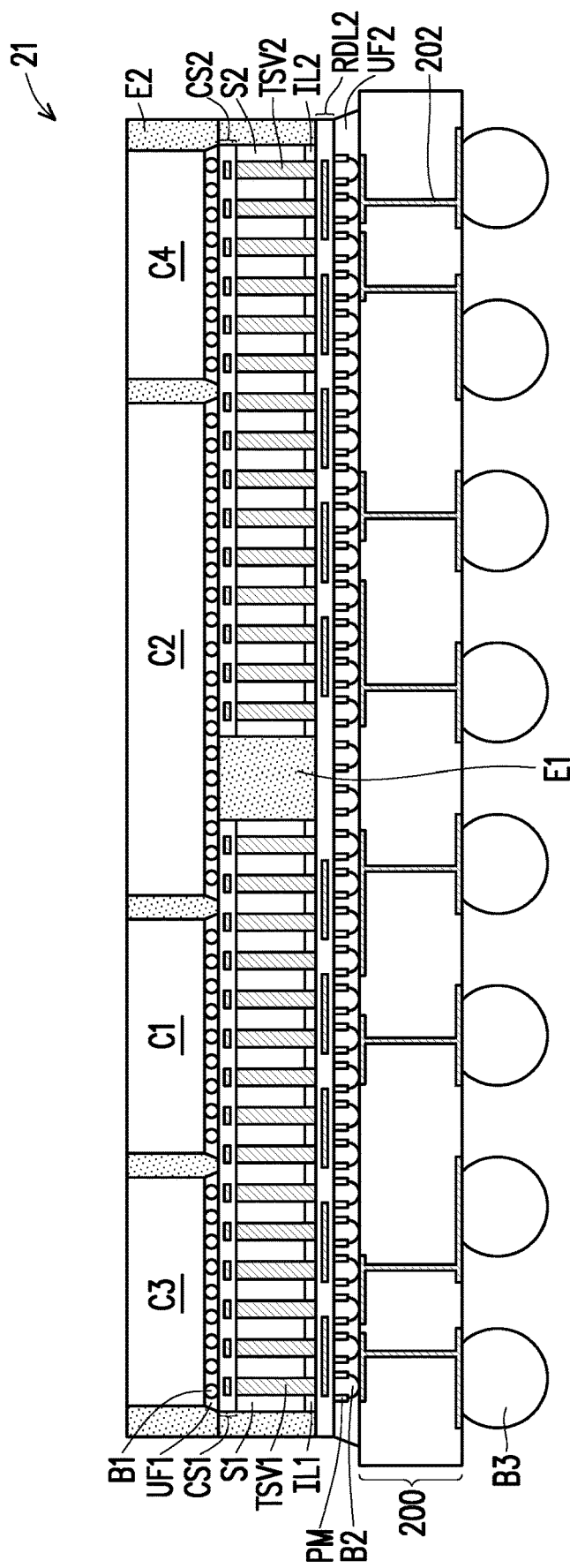
FIG. 15 to FIG. 18 are cross-sectional views of various semiconductor packages in accordance with other embodiments.

The semiconductor package 11 of FIG. 7 is similar to the semiconductor package 10 of FIG. 15, and the difference between them lies in that, the first redistribution layer structure RDL1 is provided for the semiconductor package 10 of FIG. 15 but is optionally omitted from the semiconductor package 11 of FIG. 7. Specifically, in the semiconductor package 11 of FIG. 7, the first die C1 and the third die C3 are in physical contact with the first interposer I1, the second die C2 and the fourth die C4 are in physical contact with the second interposer I2, and the bridge structure 100 is in physical contact with each of the first interposer I1 and the second interposer I2. In some embodiments, when the first dielectric encapsulation E1 and the second dielectric encapsulation E2 are made by the same material, the interface between the first dielectric encapsulation E1 and the second dielectric encapsulation E2 may be invisible. The first dielectric encapsulation E1 and the second dielectric encapsulation E2 may be regarded as a single molding layer in some examples.

Figure 8:
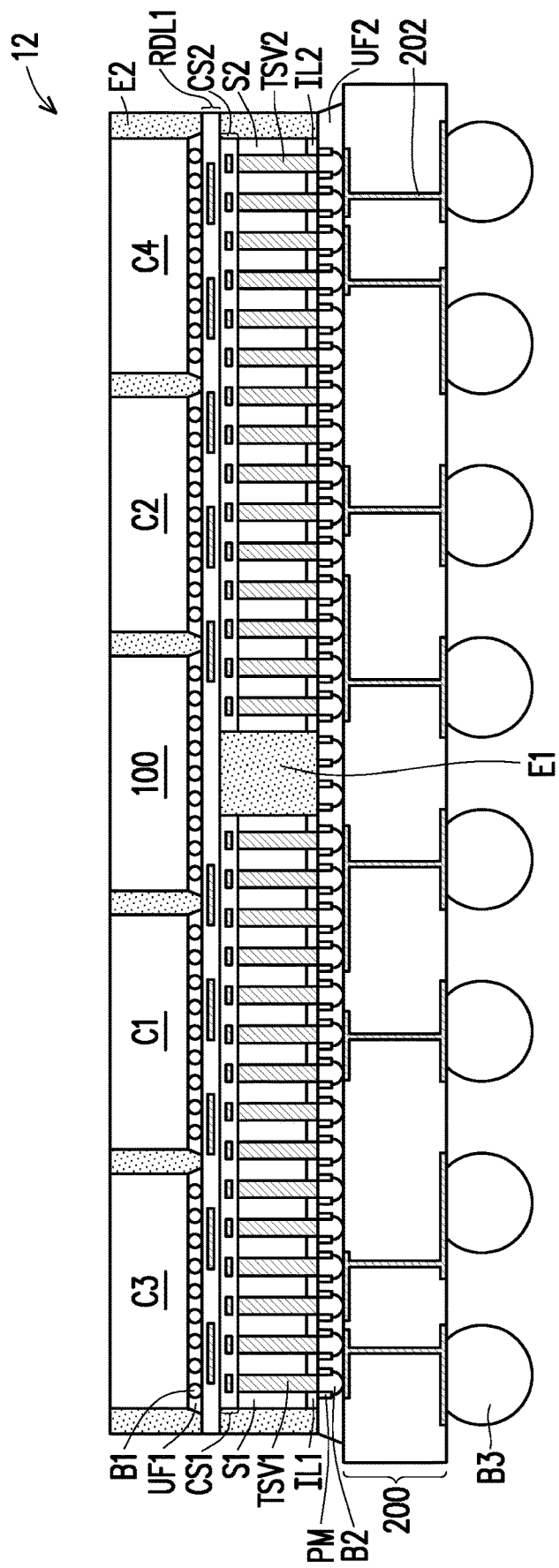

The semiconductor package 12 of FIG. 8 is similar to the semiconductor package 10 of FIG. 1S, and the difference between them lies in that, the second redistribution layer structure RDL2 is provided for the semiconductor package 10 of FIG. 1S but is optionally omitted from the semiconductor package 12 of FIG. 8. Specifically, in the semiconductor package 12 of FIG. 8, the bumps B2 are in physical contact with the first through substrate vias TSV1 of the first interposer I1 and the second through substrate vias TSV2 of the second interposer I2.

Figure 9:
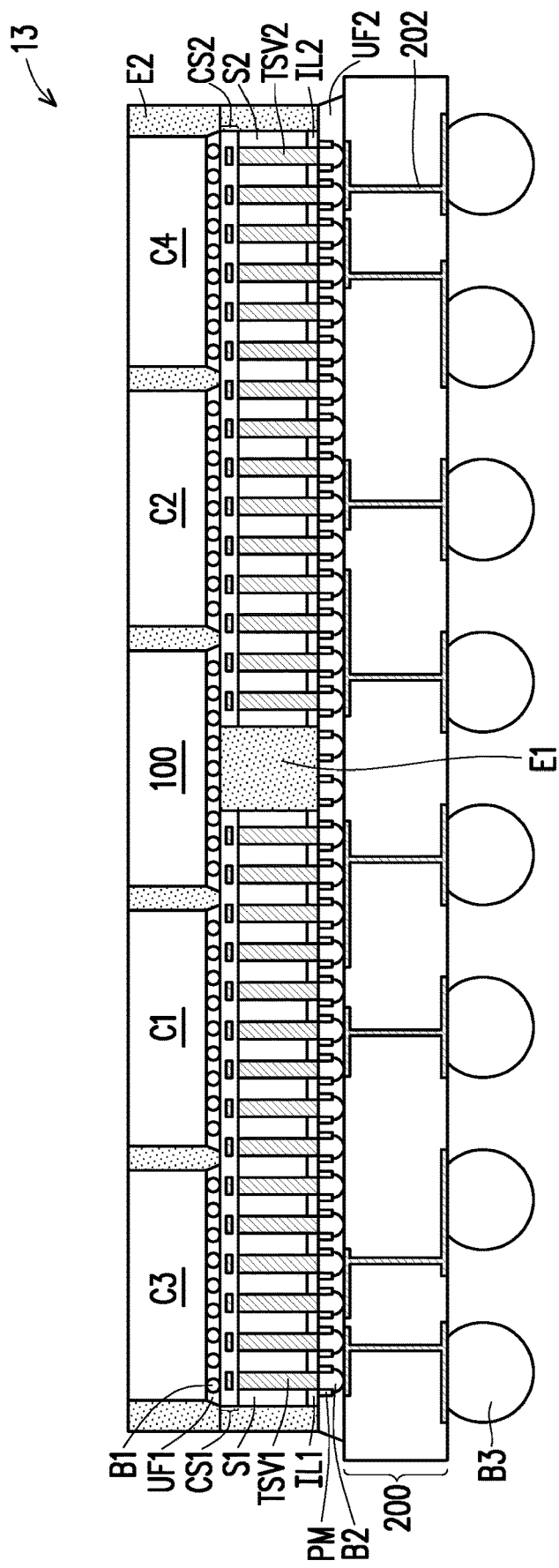
Figure 10:
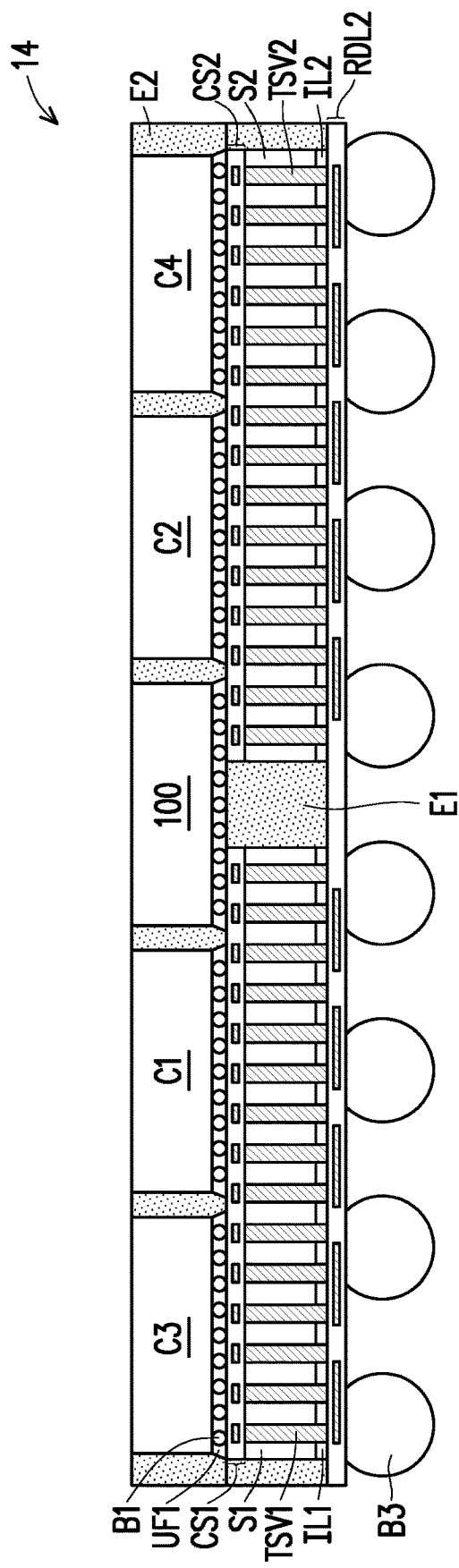

The semiconductor package 13 of FIG. 9 is similar to the semiconductor package 10 of FIG. 1S, and the difference between them lies in that, the first redistribution layer structure RDL1 and the second redistribution layer RDL2 are provided for the semiconductor package 10 of FIG. 1S but are optionally omitted from the semiconductor package 13 of FIG. 9. Specifically, in the semiconductor package 13 of FIG. 9, the first die C1 and the third die C3 are in physical contact with the first interposer I1, the second die C2 and the fourth die C4 are in physical contact with the second interposer I2, and the bridge structure 100 is in physical contact with each of the first interposer I1 and the second interposer I2. Besides, in the semiconductor package 13 of FIG. 9, the bumps B2 are in physical contact with the first through substrate vias TSV1 of the first interposer I1 and the second through substrate vias TSV2 of the second interposer I2.

Figure 10:
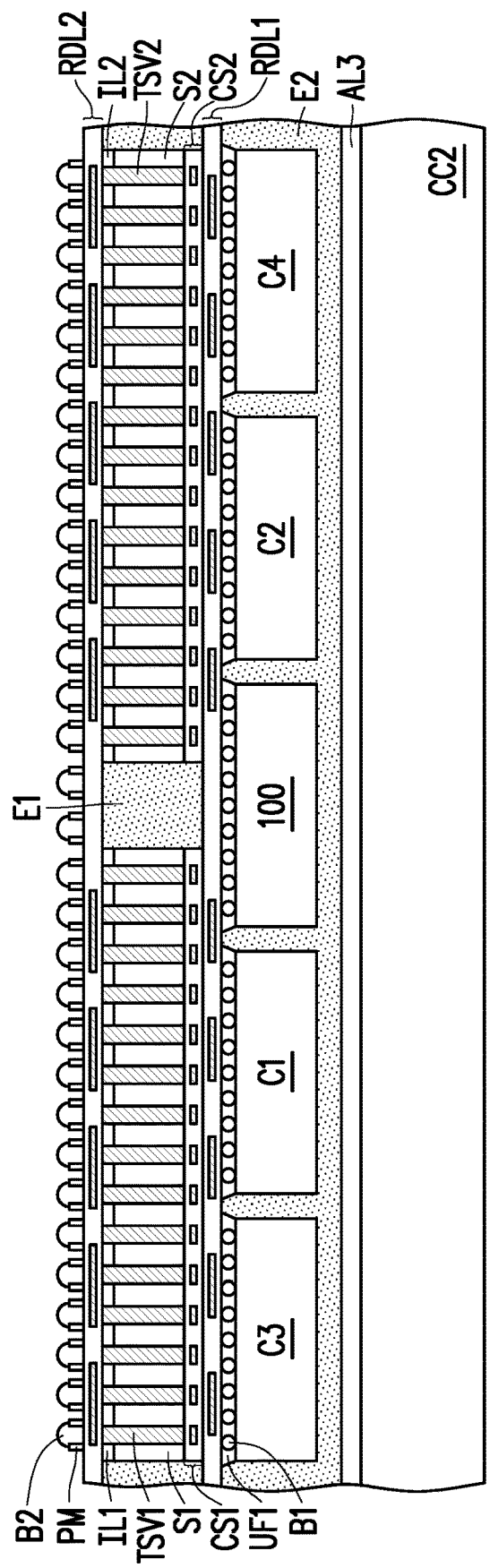
FIG. 7 to FIG. 10 are cross-sectional views of various semiconductor packages in accordance with some embodiments.

The semiconductor package 14 of FIG. 10 is similar to the semiconductor package 10 of FIG. 1S, and the difference between them lies in that, the first redistribution layer structure RDL1, the bumps B2 and the board substrate 200 are provided for the semiconductor package 10 of FIG. 1S but are optionally omitted from the semiconductor package 14 of FIG. 10. Specifically, the bumps B3 are in physical contact with the second redistribution layer structure RDL2.

The semiconductor packages of the disclosure are described below in reference to FIG. 1S, FIG. 2 to FIG. 5, and FIG. 7 to FIG. 10. It is understood that the disclosure is not limited by the structures described below. Additional features can be added in the structure and some of the features described below can be replaced or eliminated, for additional embodiments of the structure.

In some embodiments, a semiconductor package 10/11/12/13/14 includes a first interposer I1, a second interposer I2, a first die C1, a second die C2 and at least one bridge structure 100. The first interposer I1 and the second interposer I2 are embedded by a first dielectric encapsulation E1. The first die C1 is disposed over and electrically connected to the first interposer IL The second die C2 is disposed over and electrically connected to the second interposer I2. The at least one bridge structure 100 is disposed between the first die C1 and the second die C2.

In some embodiments, the semiconductor package 10/11/12/13/14 further includes a second dielectric encapsulation E2 surrounding the first die C1 and the second die C2. The material included in the second dielectric encapsulation E2 may be the same with or different from the material included in the first dielectric encapsulation E1.

In some embodiments, the semiconductor package 10/12 further includes a first redistribution layer structure RDL1 disposed between the first interposer I1 and the first die C1 and between the second interposer I2 and the second die C2.

In some embodiments, the first die C1 and the second die C2 are disposed at first sides (e.g. front sides) of the first interposer I1 and the second interposer I2, and the semiconductor package 10/11/14 further includes a second redistribution layer structure RDL2 disposed at second sides (e.g., back sides) opposite to the first sides (e.g. front sides) of the first interposer I1 and the second interposer I2.

In some embodiments, the first die C1 and the second die C2 are disposed at first sides (e.g. front sides) of the first interposer I1 and the second interposer I2, and the semiconductor package 10/11/12/13 further includes a board substrate 200 disposed at second sides (e.g., back sides) opposite to the first sides (e.g. front sides) of the first interposer I1 and the second interposer I2.

In some embodiments, the semiconductor package 10 further includes a first redistribution layer structure RDL1 disposed between the first interposer I1 and the first die C1 and between the second interposer I2 and the second die C2, and a second redistribution layer structure RDL2 disposed between the board substrate 200 and each of the first interposer I1 and the second interposer I2. In some embodiments, a critical dimension of the second redistribution layer structure RDL2 is greater than a critical dimension of the first redistribution layer structure RDL1.

In some embodiments, the semiconductor package further includes bumps B1 disposed between the first redistribution layer structure RDL1 and each of the first die C1, the second die C2 and the bridge structure 100. In some embodiments, the semiconductor package further includes bumps B2 disposed between the second redistribution layer structure RDL2 and the board substrate 200. In some embodiments, the semiconductor package further includes bumps B3 disposed at a side of the board substrate 200 opposite to the bumps B2. In some embodiments, the dimension of the bumps B3 is greater than the dimension of the bumps B2, and the dimension of the bumps B2 is greater than the dimension of the bumps B1. The dimension may be a height, a width, a size, a top-view area or a combination thereof.

In some embodiments, as shown in FIG. 1S, the bumps B1 in region R1 located between the bridge structure 100 and the underlying first dielectric encapsulation E1 (between the first and second interposers) may be omitted upon the process requirements. In some embodiments, as shown in FIG. 1S, the bumps B2 in region R2 located between the board substrate 200 and the overlying first dielectric encapsulation E1 (between the first and second interposers) may be omitted upon the process requirements.

In some embodiments (not shown), the semiconductor package further includes through dielectric vias (TDV) at the same level with the first and second interposers I1 and I2. For example, the through dielectric vias penetrate through the first dielectric encapsulation E1 and are located aside the first and second interposers I1 and I2, for providing electrical routing between dies or die stacks, or between dies and the board substrate. The through dielectric vias may penetrate through the first dielectric encapsulation E1 between the first and second interposers I1 and I2. The through dielectric vias may penetrate through the first dielectric encapsulation E1 at outer sides of the first and second interposers I1 and I2.

In some embodiments, each of the first interposer I1 and the second interposer I2 is a passive interposer. In some embodiments, each of the first interposer I1 and the second interposer I2 is an active interposer. In some embodiments, the gap width between the first interposer I1 and the second interposer I2 is substantially equal to less than about 150 um.

In some embodiments, the first interposer I1 includes first through substrate vias TSV1 and a first conductive structure CS1 over the first through substrate vias TSV1, and the first conductive structure CS1 is electrically connected to the first die C1. In some embodiments, the second interposer I2 includes second through substrate vias TSV2 and a second conductive structure CS2 over the second through substrate vias TSV2, and the second conductive structure CS2 is electrically connected to the second die C2.

In some embodiments, a critical dimension of the first conductive structure CS1 close to the first die C1 is greater than a critical dimension of the first conductive structure CS1 away from the first die C1. In some embodiments, a critical dimension of the second conductive structure CS2 close to the second die C2 is greater than a critical dimension of the second conductive structure CS2 away from the second die C2.

In some embodiments, the semiconductor package 10/11/12/13/14 further includes a third die C3 disposed over the first interposer I1 and aside the first die C1, and a fourth die C4 disposed over the second interposer I2 and aside the second die C2. In some embodiments, the first and second dies C1 and C2 are SoC dies, and the third and fourth dies C3 and C4 are memory dies.

In some embodiments, the at least one bridge structure 100 is a device-free die. In some embodiments, the at least one bridge structure 100 is partially overlapped with each of the first interposer I1 and the second interposer I2. However, the disclosure is not limited thereto. In other embodiments (not shown), at least one of multiple bridge structures 100 may be merely partially overlapped with one of the first interposer I1 and the second interposer I2 due to the space limitation. In other embodiments, at least one of multiple bridge structures 100 may be partially overlapped with the first dielectric encapsulation E1 between the first interposer I1 and the second interposer I2.

In the above embodiments, at least one bridge structure is configured to provide electrical routing between separate interposers and therefore separate semiconductor dies. However, the present disclosure is not limited thereto. In other embodiments, the bridge structure may be omitted, and one of the semiconductor dies provides the function similar to the bridge structure. Such semiconductor die is referred to as a "device-containing bridge die" in some examples.

Figure 11:
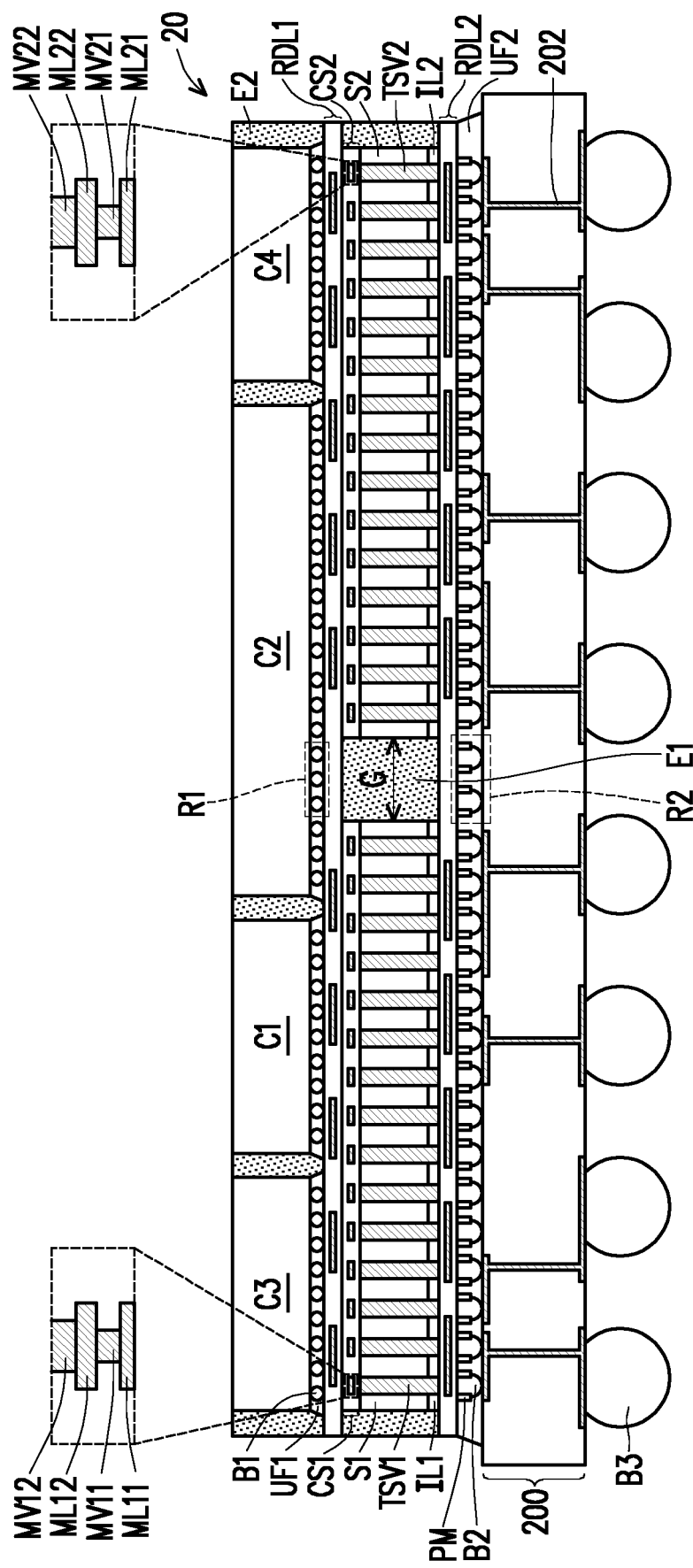
FIG. 11 is a cross-sectional view of a semiconductor package in accordance with other embodiments.

FIG. 11 is a cross-sectional view of a semiconductor package in accordance with other embodiments. The structure of FIG. 11 is similar to the structure of FIG. 1S, so the difference between them is described in details below and the similarity is not iterated herein. The materials and configurations of elements of FIG. 11 may refer to those of similar elements described in the previous embodiments.

Figure 12:
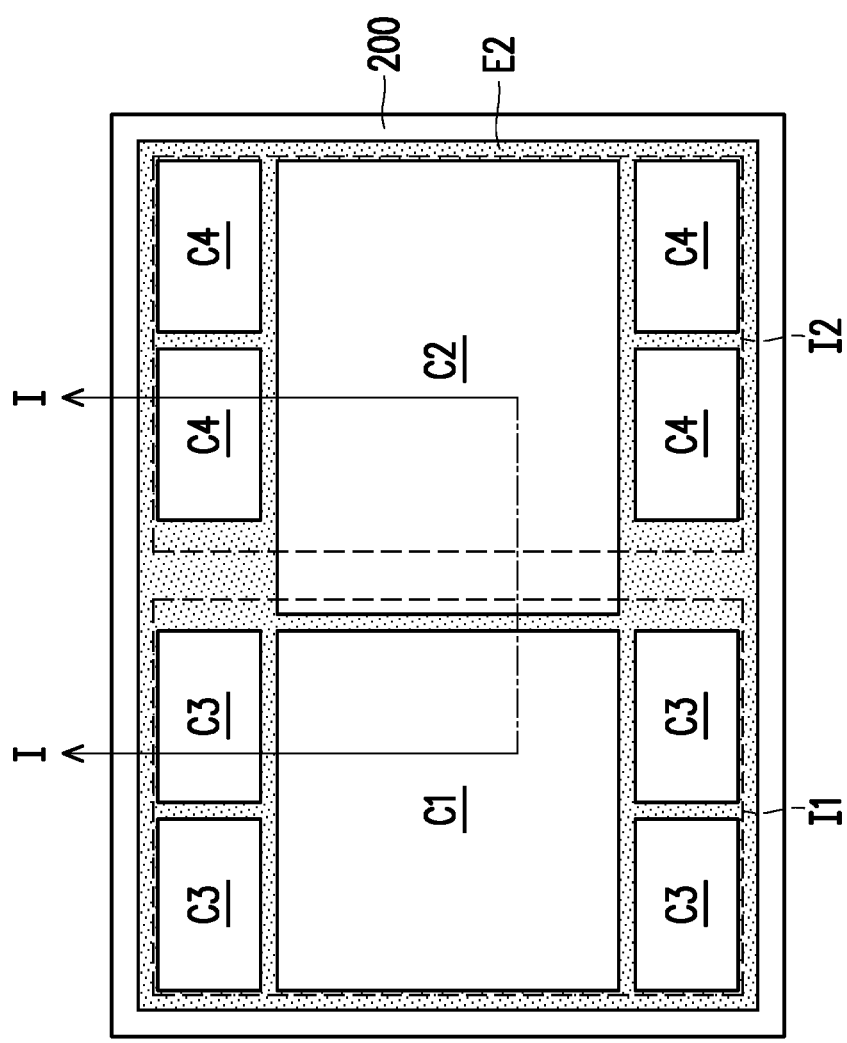
FIG. 12 to FIG. 13 are schematic top views of semiconductor packages in accordance with other embodiments.

FIG. 12 is a schematic top view of a semiconductor package in accordance with other embodiments. For simplicity and clarity of illustration, only few elements are shown in the top view of FIG. 12. In some embodiments, FIG. 11 is a cross-sectional view of a semiconductor package along the line I-I of FIG. 12.

Referring to FIG. 11 and FIG. 12, a semiconductor package 20 includes a first interposer I1 and a second interposer I2 embedded by a first dielectric encapsulation E1. The semiconductor package 20 further includes a first die C1 disposed over and electrically connected to the first interposer I1, and a second die C2 disposed over and electrically connected to the second interposer I2. One of the first die C1 and the second die C2 (e.g., the second die C2 in the present example) is configured to electrically connect the first interposer I1 to the second interposer I2. Specifically, the second die C2 is formed over the second interposer I2, laterally across the first dielectric encapsulation E1 between the first interposer I1 and the second interposer I2, and extends onto the first interposer I1. In some embodiments, the semiconductor package 20 further includes a plurality of third dies C3 disposed over the first interposer I1 and aside the first die C1, and a plurality of fourth dies C4 disposed over the second interposer I2 and aside the second die C2. In some embodiments, the third dies C3 are at two sides of the first die C1, and the fourth dies C4 are at two sides of the second die C2. In some embodiments, the semiconductor package 20 further includes a board substrate 200 disposed below the first interposer I1 and the second interposer I2.

In some embodiments of the disclosure, the interposers are provided as chiplets with a smaller size, and semiconductor dies are provided over the interposers and electrically connected to each other through at least one of the semiconductor dies and the underlying interposers. By such manner, the production yield can be significantly improved. In some embodiments, since the interposers of the disclosure are chiplets instead of the conventional single bulk interposer, the semiconductor package of the disclosure is called a "chip on fan-out on substrate (CoFoS)" structure.

The top-view configuration of the FIG. 12 may be modified as needed. One modified example is provided below for illustration purposes, and is not to be construed as limiting the scope of the present disclosure. It is appreciated by people having ordinary skill in the art that other top-view configurations of the semiconductor packages are possible.

Figure 13:
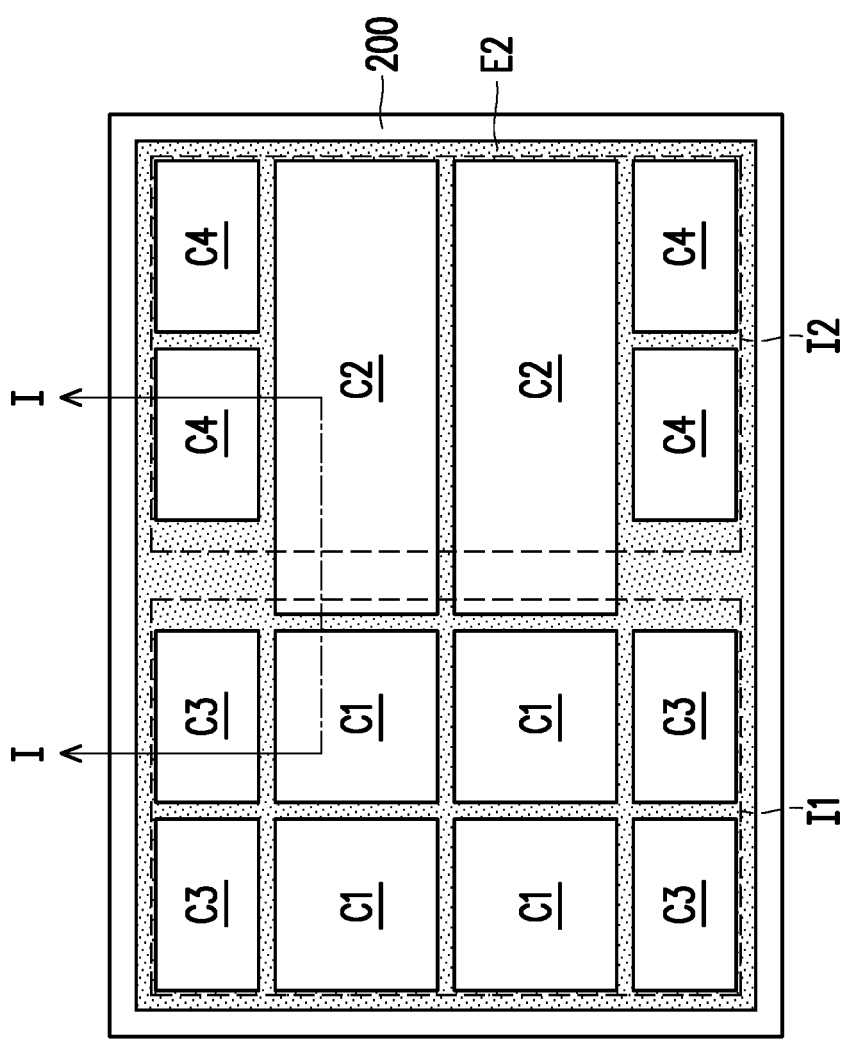

In some embodiments, as shown in FIG. 13, four first dies C1 are provided over the first interposer I1, and two second dies C2 are provided over the second interposer I2 and extend onto the first interposer I1. In some embodiments, FIG. 11 is a cross-sectional view of a semiconductor package along the line I-I of FIG. 13.

In view of the above, the numbers of semiconductor dies (e.g., first to fourth dies) at two opposite sides may be the same or different upon the process requirements.

The method of forming the semiconductor package 20 is similar to the method of forming the semiconductor package 10 described in FIG. 1A to FIG. 1S, except that a bridge structure is omitted during the die pick-and-place operation of FIG. 1E. Specifically, the second die C2 of the semiconductor package 20 provides the function of the bridge structure 100 of semiconductor package 10.

Figure 14:
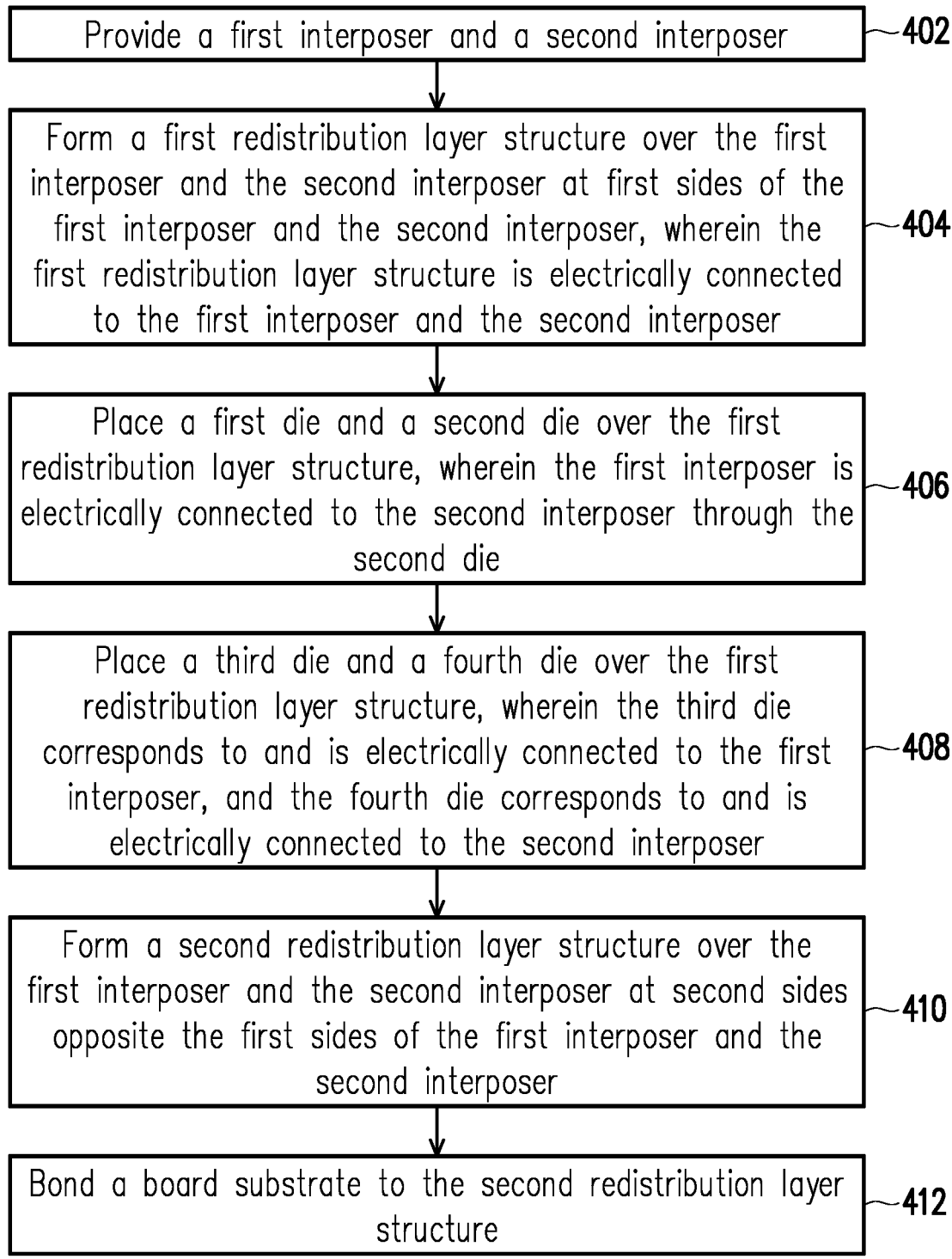
FIG. 14 illustrates a method of forming a semiconductor package in accordance with other embodiments.

FIG. 14 illustrates a method of forming a semiconductor package in accordance with other embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 402, a first interposer and a second interposer are provided.

At act 404, a first redistribution layer structure is formed over the first interposer and the second interposer at first sides of the first interposer and the second interposer, wherein the first redistribution layer structure is electrically connected to the first interposer and the second interposer. In some embodiments, the first sides are front sides of the first interposer and the second interposer.

At act 406, a first die and a second die are placed over the first redistribution layer structure, wherein the first interposer is electrically connected to the second interposer through the second die. The sequence of placing the first die and the second die is not limited by the disclosure. In some embodiments, the first die corresponds to and is electrically connected to the first interposer, and the second die corresponds to the second interposer and is electrically connected to the first interposer and the second interposer.

At act 408, a third die and a fourth die are placed over the first redistribution layer structure, wherein the third die corresponds to and is electrically connected to the first interposer, and the fourth die corresponds to and is electrically connected to the second interposer. In some embodiments, the third die and the first die provide different functions and are located at the same side, and the fourth die and the second die provide different functions and are located at the same side. The sequence of placing the third die and the fourth die is not limited by the disclosure. Besides, the sequence of act 406 and act 408 may be exchanged as needed. In some embodiments, act 408 is optional, and may be omitted as needed.

At act 410, a second redistribution layer structure is formed over the first interposer and the second interposer at second sides opposite the first sides of the first interposer and the second interposer. In some embodiments, the second sides are back sides of the first interposer and the second interposer.

At act 412, a board substrate is bonded to the second redistribution layer structure.

The semiconductor package of FIG. 11 may be modified upon the process requirements. FIG. 15 to FIG. 18 are cross-sectional views of various semiconductor packages in accordance with alternative embodiments. The semiconductor packages of FIG. 15 to FIG. 18 are beneficial for cost reduction and/or size reduction. The difference between them is described in details below, and the similarity is not iterated herein.

The semiconductor package 21 of FIG. 15 is similar to the semiconductor package 20 of FIG. 11, and the difference between them lies in that, the first redistribution layer structure RDL1 is provided for the semiconductor package 20 of FIG. 11 but is optionally omitted from the semiconductor package 21 of FIG. 15. Specifically, in the semiconductor package 21 of FIG. 15, the first die C1 and the third die C3 are in physical contact with the first interposer I1, the second die C2 is in physical contact with the first interposer I1 and the second interposer I2, and the fourth die C4 is in physical contact with the second interposer I2.

Figure 16:
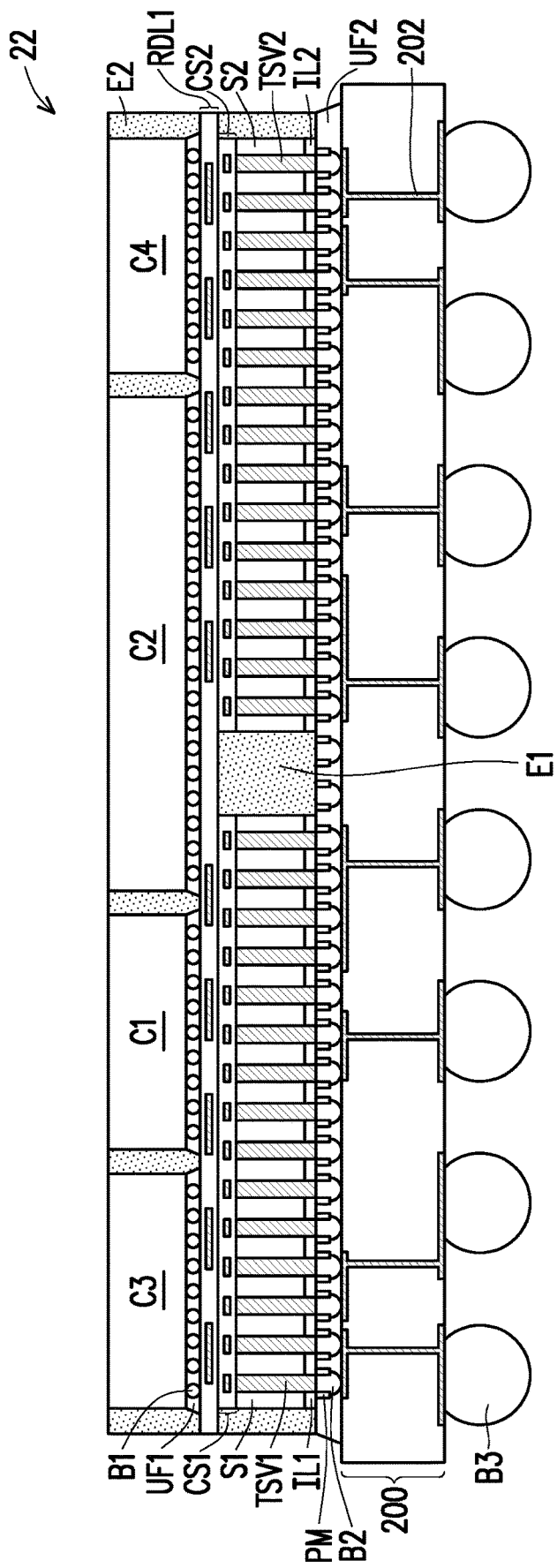

The semiconductor package 22 of FIG. 16 is similar to the semiconductor package 20 of FIG. 11, and the difference between them lies in that, the second redistribution layer structure RDL2 is provided for the semiconductor package 20 of FIG. 11 but is optionally omitted from the semiconductor package 22 of FIG. 16. Specifically, in the semiconductor package 22 of FIG. 16, the bumps B2 are in physical contact with the first through substrate vias TSV1 of the first interposer I1 and the second through substrate vias TSV2 of the second interposer I2.

Figure 17:
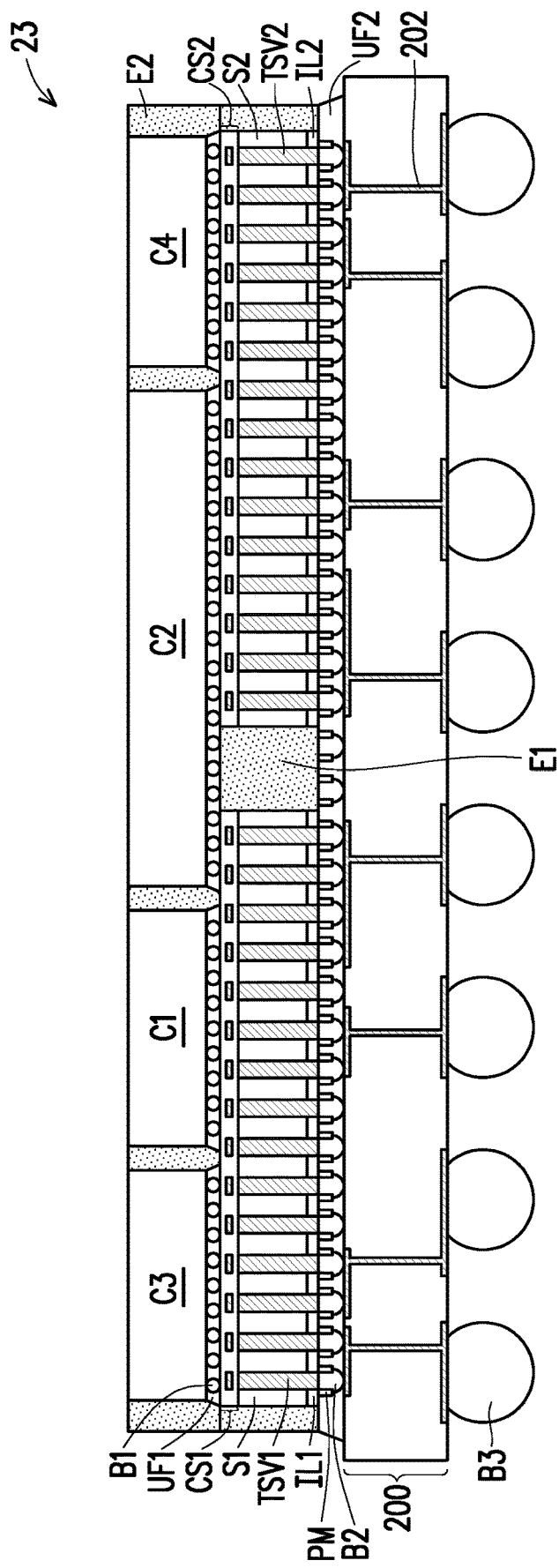

The semiconductor package 23 of FIG. 17 is similar to the semiconductor package 20 of FIG. 11, and the difference between them lies in that, the first redistribution layer structure RDL1 and the second redistribution layer RDL2 are provided for the semiconductor package 20 of FIG. 11 but are optionally omitted from the semiconductor package 23 of FIG. 17. Specifically, in the semiconductor package 23 of FIG. 17, the first die C1 and the third die C3 are in physical contact with the first interposer I1, the second die C2 is in physical contact with the first interposer I1 and the second interposer I2, and the fourth die C4 is in physical contact with the second interposer I2. Besides, in the semiconductor package 23 of FIG. 17, the bumps B2 are in physical contact with the first through substrate vias TSV1 of the first interposer I1 and the second through substrate vias TSV2 of the second interposer I2.

Figure 18:
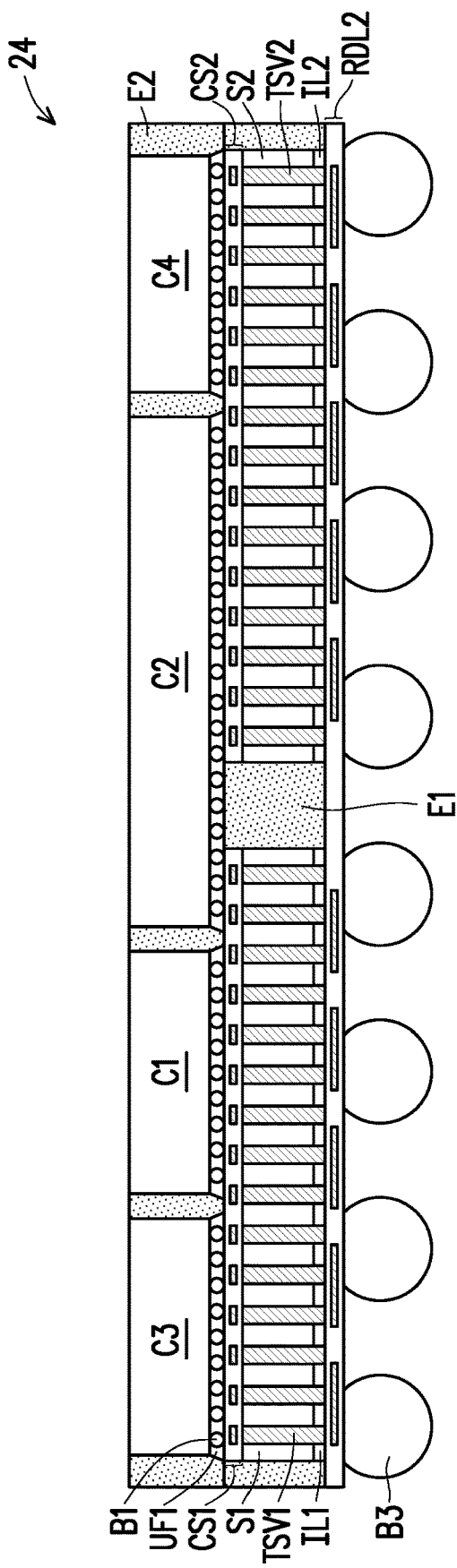

The semiconductor package 24 of FIG. 18 is similar to the semiconductor package 20 of FIG. 11, and the difference between them lies in that, the first redistribution layer structure RDL1, the bumps B2 and the board substrate 200 are provided for the semiconductor package 20 of FIG. 11 but are optionally omitted from the semiconductor package 24 of FIG. 18. Specifically, the bumps B3 are in physical contact with the second redistribution layer structure RDL2.

The semiconductor packages of the disclosure are described below in reference to FIG. 11 to FIG. 13, and FIG. 15 to FIG. 18. It is understood that the disclosure is not limited by the structures described below. Additional features can be added in the structure and some of the features described below can be replaced or eliminated, for additional embodiments of the structure.

In some embodiments, a semiconductor package 20/21/22/23 includes a board substrate 200, a first interposer I1, a second interposer I2, a first die C1 and a second die C2. In some embodiments, the board substrate 200 includes a core layer and two build-up layers on opposite sides of the core layer. In other embodiments, the core layer of the board substrate 200 may be omitted as needed, and such board substrate 200 is referred to as a "coreless board substrate". The first interposer I1 and the second interposer I2 are disposed over the board substrate 200. The first die C1 is disposed over the first interposer I1. The second die C2 is disposed over the second interposer I2 and extends onto the first interposer I1. In some embodiments, the second die C2 is partially overlapped with each of the first interposer I1 and the second interposer I2.

In some embodiments, the semiconductor package 20/21/22/23/24 further includes a first dielectric encapsulation E1 surrounding the first interposer I1 and the second interposer I2, and a second dielectric encapsulation E2 surrounding the first die C1 and the second die C2. The material included in the second dielectric encapsulation E2 may be the same with or different from the material included in the first dielectric encapsulation E1.

In some embodiments, the semiconductor package 20/22 further includes a first redistribution layer structure RDL1 disposed between the first interposer I1 and the first die C1 and between the second interposer I1 and the second die C2.

In some embodiments, the semiconductor package 20/21/24 further includes a second redistribution layer structure RDL2 disposed between the board substrate 200 and each of the first interposer I1 and the second interposer I2.

In some embodiments, a critical dimension of the second redistribution layer structure RDL2 is greater than a critical dimension of the first redistribution layer structure RDL1.

In some embodiments, the semiconductor package further includes bumps B1 disposed between the first redistribution layer structure RDL1 and each of the first die C1 and the second die C2. In some embodiments, the semiconductor package further includes bumps B2 disposed between the second redistribution layer structure RDL2 and the board substrate 200. In some embodiments, the semiconductor package further includes bumps B3 disposed at a side of the board substrate 200 opposite to the bumps B2. In some embodiments, the dimension of the bumps B3 is greater than the dimension of the bumps B2, and the dimension of the bumps B2 is greater than the dimension of the bumps B1. The dimension may be a height, a width, a size, a top-view area or a combination thereof.

In some embodiments, as shown in FIG. 11, the bumps B1 in region R1 located between the second die C2 and the underlying first dielectric encapsulation E1 (between the first and second interposers) may be omitted upon the process requirements. In some embodiments, as shown in FIG. 11, the bumps B2 in region R2 located between the board substrate 200 and the overlying first dielectric encapsulation E1 (between the first and second interposers) may be omitted upon the process requirements.

In some embodiments (not shown), the semiconductor package further includes through dielectric vias (TDV) at the same level with the first and second interposers I1 and I2. For example, the through dielectric vias penetrate through the first dielectric encapsulation E1 and are located aside the first and second interposers I1 and I2, for providing electrical routing between dies or die stacks, or between dies and the board substrate. The through dielectric vias may penetrate through the first dielectric encapsulation E1 between the first and second interposers I1 and I2. The through dielectric vias may penetrate through the first dielectric encapsulation E1 at outer sides of the first and second interposers I1 and I2.

In some embodiments, each of the first interposer I1 and the second interposer I2 is a passive interposer. In some embodiments, each of the first interposer I1 and the second interposer I2 is an active interposer. In some embodiments, the gap width between the first interposer I1 and the second interposer I2 is substantially equal to less than about 150 um.

In some embodiments, the first interposer I1 includes first through substrate vias TSV1 and a first conductive structure CS1 over the first through substrate vias TSV1, and the first conductive structure CS1 is electrically connected to the first die C1. In some embodiments, the second interposer I2 includes second through substrate vias TSV2 and a second conductive structure CS2 over the second through substrate vias TSV2, and the second conductive structure CS2 is electrically connected to the second die C2.

In some embodiments, a critical dimension of the first conductive structure CS1 close to the first die C1 is greater than a critical dimension of the first conductive structure CS1 away from the first die C1. In some embodiments, a critical dimension of the second conductive structure CS2 close to the second die C2 is greater than a critical dimension of the second conductive structure CS2 away from the second die C2.

In some embodiments, the semiconductor package 20/21/22/23/24 further includes a third die C3 disposed over the first interposer I1 and aside the first die C1, and a fourth die C4 disposed over the second interposer I2 and aside the second die C2. In some embodiments, the first and second dies C1 and C2 are SoC dies, and the third and fourth dies C3 and C4 are memory dies.

In view of the foregoing, in some embodiments of the disclosure, the interposers are provided as chiplets with a smaller size, and semiconductor dies are provided over the interposers and electrically connected to each other through at least one bridge structure or one of the semiconductor dies. In some embodiments, the interposers of the disclosure are subjected to a testing process before the pick-and-place operation of the interposers, so all of the interposers of the disclosure are known good interposers. By such manner, the production yield can be significantly improved and the production cost can be greatly reduced.

Many variations of the above examples are contemplated by the present disclosure. It is understood that different embodiments may have different advantages, and that no particular advantage is necessarily required of all embodiments.

In accordance with some embodiments of the present disclosure, a semiconductor package includes a first interposer, a second interposer, a first die, a second die and at least one bridge structure. The first interposer and the second interposer are embedded by a first dielectric encapsulation. The first die is disposed over and electrically connected to the first interposer. The second die is disposed over and electrically connected to the second interposer. The at least one bridge structure is disposed between the first die and the second die.

In accordance with alternative embodiments of the present disclosure, a method of forming a semiconductor package includes following operations. A first interposer and a second interposer are provided. A first redistribution layer structure is formed over the first interposer and the second interposer at first sides of the first interposer and the second interposer, wherein the first redistribution layer structure is electrically connected to the first interposer and the second interposer. A first die, a second die and at least one bridge structure are placed over the first redistribution layer structure, wherein the first interposer is electrically connected to the second interposer through the at least one bridge structure between the first die and the second die. A second redistribution layer structure is formed over the first interposer and the second interposer at second sides opposite to the first sides of the first interposer and the second interposer. A board substrate is bonded to the second redistribution layer structure.

In accordance with yet alternative embodiments of the present disclosure, a semiconductor package includes a board substrate, a first interposer, a second interposer, a first die and a second die. The first interposer and the second interposer are disposed over the board substrate. The first die is disposed over the first interposer. The second die is disposed over the second interposer and extends onto the first interposer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first interposer and a second interposer embedded by a first dielectric encapsulation;
   a first die disposed over and electrically connected to the first interposer;
   a second die disposed over and electrically connected to the second interposer; and
   at least one bridge structure disposed between the first die and the second die,
   wherein the first interposer comprises first through substrate vias and a first conductive structure over the first through substrate vias, and the first conductive structure is electrically connected to the first die, and
   wherein a critical dimension of the first conductive structure closer to the first die is greater than a critical dimension of the first conductive structure farther away from the first die.

2. The semiconductor package of claim 1, further comprising a redistribution layer structure disposed between the first interposer and the first die and between the second interposer and the second die.

3. The semiconductor package of claim 1, wherein the first die and the second die are disposed at first sides of the first interposer and the second interposer, and the semiconductor package further comprises a redistribution layer structure disposed at second sides opposite to the first sides of the first interposer and the second interposer.

4. The semiconductor package of claim 1, wherein the first die and the second die are disposed at first sides of the first interposer and the second interposer, and the semiconductor package further comprises a board substrate disposed at second sides opposite to the first sides of the first interposer and the second interposer.

5. The semiconductor package of claim 4, further comprising:
   a first redistribution layer structure disposed between the first interposer and the first die and between the second interposer and the second die; and a second redistribution layer structure disposed between the board substrate and each of the first interposer and the second interposer.

6. The semiconductor package of claim 5, wherein a critical dimension of the second redistribution layer structure is greater than a critical dimension of the first redistribution layer structure.

7. The semiconductor package of claim 1, wherein each of the first interposer and the second interposer is a passive interposer.

8. The semiconductor package of claim 1, wherein each of the first interposer and the second interposer is an active interposer.

9. The semiconductor package of claim 1, wherein the second interposer comprises second though substrate vias and a second conductive structure over the second through substrate vias, and the second conductive structure is electrically connected to the second die.

10. The semiconductor package of claim 9, wherein a critical dimension of the second conductive structure closer to the second die is greater than a critical dimension of the second conductive structure farther away from the second die.

11. The semiconductor package of claim 1, further comprising:
a third die disposed over the first interposer and aside the first die; and
a fourth die disposed over the second interposer and aside the second die.

12. The semiconductor package of claim 11, wherein the at least one bridge structure is a device-free die.

13. The semiconductor package of claim 1, wherein the at least one bridge structure is partially overlapped with each of the first interposer and the second interposer.

14. A semiconductor package, comprising:
a board substrate;
a first interposer and a second interposer disposed over the board substrate;
a first die disposed over the first interposer;
a second die disposed over the second interposer and extending onto the first interposer;
a first redistribution layer structure disposed between the first interposer and the first die and between the second interposer and the second die; and
a second redistribution layer structure disposed between the board substrate and each of the first interposer and the second interposer.

15. The semiconductor package of claim 14, wherein a critical dimension of the second redistribution layer structure is different from a critical dimension of the first redistribution layer structure.

16. The semiconductor package of claim 15, wherein the critical dimension of the second redistribution layer structure is greater than the critical dimension of the first redistribution layer structure.

17. The semiconductor package of claim 14, further comprising:
a third die disposed over the first interposer and aside the first die; and
a fourth die disposed over the second interposer and aside the second die.

18. The semiconductor package of claim 14, further comprising:
a first dielectric encapsulation surrounding the first interposer and the second interposer; and
a second dielectric encapsulation surrounding the first die and the second die.

19. A semiconductor package, comprising:
a first interposer and a second interposer disposed side by side;
a first die disposed over the first interposer;
a second die disposed over the second interposer;
at least one bridge structure disposed between the first die and the second die;
a board substrate disposed below the first interposer and the second interposer;
a first redistribution layer structure disposed between the first interposer and the first die and between the second interposer and the second die; and
a second redistribution layer structure disposed between the board substrate and each of the first interposer and the second interposer.

20. The semiconductor package of claim 19, wherein a critical dimension of the second redistribution layer structure is different from a critical dimension of the first redistribution layer structure.

* * * * *